United States Patent
Suzuki et al.

(10) Patent No.: US 7,030,030 B2
(45) Date of Patent: Apr. 18, 2006

(54) METHOD OF MANUFACTURING A SEMICONDUCTOR INTEGRATED CIRCUIT DEVICE HAVING A PLURALITY OF WIRING LAYERS AND MASK-PATTERN GENERATION METHOD

(75) Inventors: Kazuhisa Suzuki, Hamura (JP); Kazuo Koide, Iruma (JP); Toshiro Takahashi, Hamura (JP)

(73) Assignee: Renasas Technology Corp., Tokyo (JP)

( * ) Notice: Subject to any disclaimer, the term of this patent is extended or adjusted under 35 U.S.C. 154(b) by 156 days.

(21) Appl. No.: 10/688,902

(22) Filed: Oct. 21, 2003

(65) Prior Publication Data

US 2004/0092124 A1    May 13, 2004

Related U.S. Application Data

(62) Division of application No. 09/959,576, filed as application No. PCT/JP99/02315 on Apr. 30, 1999, now abandoned.

(51) Int. Cl.
*H01L 21/302* (2006.01)

(52) U.S. Cl. ............. 438/720; 438/622; 438/629; 438/706

(58) Field of Classification Search ......... 438/637, 438/638, 642, 652, 706, 720, 618, 622, 629
See application file for complete search history.

(56) References Cited

U.S. PATENT DOCUMENTS

| 5,272,600 | A | | 12/1993 | Carey |
| 6,165,899 | A | * | 12/2000 | Matumoto ............ 438/638 |
| 6,305,002 | B1 | | 10/2001 | Uchida |
| 6,362,528 | B1 | * | 3/2002 | Anand .................. 257/758 |

FOREIGN PATENT DOCUMENTS

| JP | 59-72152 | 4/1984 |
| JP | 5-283611 | 10/1993 |
| JP | 10-22455 | 1/1998 |

* cited by examiner

*Primary Examiner*—Lan Vinh
(74) *Attorney, Agent, or Firm*—Antonelli, Terry, Stout and Kraus, LLP.

(57) ABSTRACT

A method is provided for manufacturing an integrated circuit device having a plurality of wiring layers including a first wiring layer which is not the upper most layer among the plurality of wiring layers and a second wiring layer higher than the first wiring layer in the plurality of wiring layers. An interlayer dielectric film is provided to cover the first wiring layer. Holes are then formed in the interlayer dielectric film and a mask film is formed to cover some of the holes. Etching using the mask film is then carried out and an insulating film formed on the interlayer dielectric film is removed, including the bottoms and/or insides of the holes. The mask film is then removed and a conductive member is formed inside the holes.

37 Claims, 35 Drawing Sheets

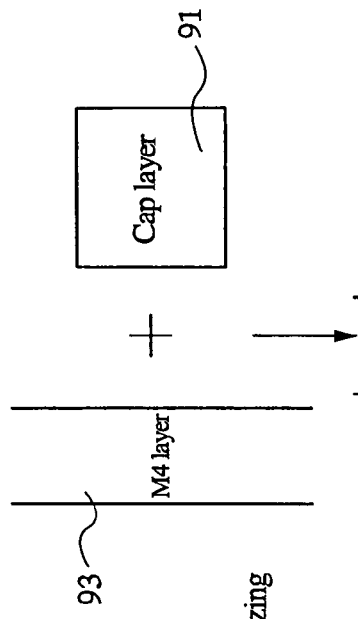
Fig. 33A
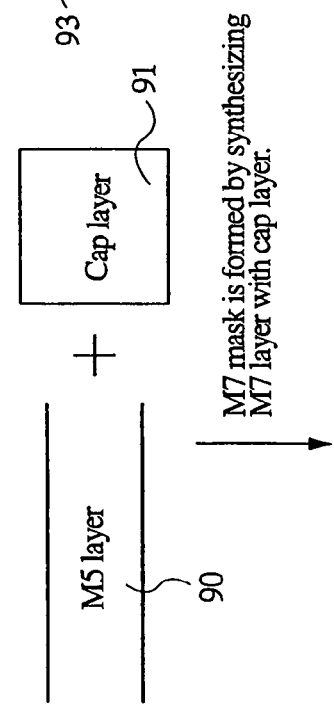
Fig. 33B
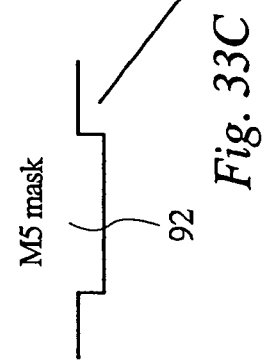
Fig. 33C
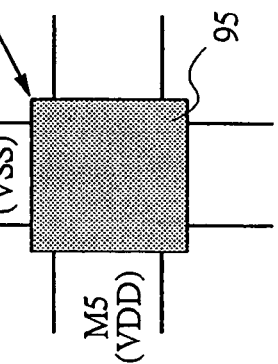

METHOD OF MANUFACTURING A SEMICONDUCTOR INTEGRATED CIRCUIT DEVICE HAVING A PLURALITY OF WIRING LAYERS AND MASK-PATTERN GENERATION METHOD

CROSS-REFERENCE TO RELATED APPLICATIONS

This application is a Divisional application of application Ser. No. 09/959,576, filed Oct. 30, 2001 now abandoned, which was filed from a PCT application number PCT/JP99/02315, filed Apr. 30, 1999, the entire disclosure of which is hereby incorporated by reference.

TECHNICAL FIELD

The present invention relates to a semiconductor integrated circuit device and its manufacturing method, and, particularly, to an art intended to be effectively applied to the stabilization of a power source of an advanced semiconductor integrated circuit device and the reduction of power-source noises.

BACKGROUND ART

Because semiconductor integrated circuit devices have been improved in performance and reduced in size, the multilayer-wiring art is an art that is indispensable for manufacturing of such semiconductor integrated circuit devices. For example, to form a wiring layer of a semiconductor integrated circuit, a method is known in which a thin film made of a refractory metal such as an aluminum (Al) alloy or tungsten (W) is formed on an insulating film, then a resist pattern having a shape which is the same as that of a wiring pattern is formed on a wiring thin film in a photolithography step, and then a wiring pattern is formed in a dry etching step by using the resist pattern as a mask. However, as the wiring is made finer, the method using an Al alloy or the like has problems that wiring resistance remarkably increases, and thereby, the wiring delay increases, and the performance of the semiconductor integrated circuit device deteriorates. Particularly, a large problem for advanced logic LSI is its performance deterioration factor.

Therefore, a method (so-called damascene method) has been studied in which a wiring metal using copper (Cu) as a main conductive layer is embedded in a trench formed on an insulating film, and excessive metal outside of the trench is removed by the CMP (Chemical Mechanical Polishing) method, and thereby, a wiring pattern is formed in the trench.

Moreover, the problem of wiring capacity is a factor which causes an operation delay in the semiconductor integrated circuit device in addition to wiring resistance. Improving the integration degree and reducing the size of a semiconductor integrated circuit device are not preferable solutions because, as the inter-wiring dimension is decreased, the inter-wiring capacity is increased, and thus circuit-operation delay is increased. Therefore, a low-permittivity material such as a silicon-oxide film is generally used for an interlayer dielectric film for insulating and wiring from another.

However, the present inventors recognize that the generation of AC noises during circuit operation becomes a problem as the integration degree and operation speed of the semiconductor integrated circuit device are improved, and the operating voltage is lowered. That is, when a fine circuit device performs a high-speed operation at a specified section, a phenomenon locally occurs in that the power-source impedance of the section lowers. This is observed as a local lowering of the power-source voltage which is to be supplied to a circuit. Moreover, because the phenomenon is observed as a temporally fluctuating voltage, it is detected as local AC noises. In the case of a circuit driven at a low voltage, the above AC noises particularly influence the circuit, and they may cause circuit operations to be unstable. Also, when the noises are extreme, they may cause the circuit to malfunction.

The process of connecting a proper capacitive element (power-source stabilizing capacitor) between power-source lines {Vdd and Vss (Vdd>Vss)} in order to prevent the AC noises was considered in the present inventors' studies. Though not a publicly-known art, the following means are studied as specific countermeasures.

When a semiconductor integrated circuit device is a cell-based IC (CBIC: Cell Based Integrated Circuit) according to the standard cell system or the like, a countermeasure is provided of separately forming a capacitive element (MIS capacitive element) for stabilizing the power source in a certain area in the IC by using a gate-insulating film and connecting the capacitive element to a power-source line. That is, as shown in FIG. 34A, a sufficient capacity value can be obtained by separately setting a capacitive cell C, as shown in FIG. 34A, and increasing the gate-electrode length L and width W of an MISFET (Metal Insulator Semiconductor Field Effect Transistor) in the capacitive cell as shown in FIG. 34C.

FIGS. 34A to 34C are illustrations which explain problems of the present invention, FIG. 34A is a plan view of a semiconductor integrated circuit device in which standard cells are formed in an internal area, FIG. 34B is an enlarged plan view of a capacitive cell area, FIG. 34C is an enlarged plan view of a capacitive cell, and FIG. 34D is a sectional view taken along the line d–d' in FIG. 34C. Thus, a capacitive element is constituted by electrically connecting the power-source line Vdd to the gate electrode of the MISFET in the capacitive cell, thereby using the gate electrode as one electrode of the capacitive element, using a p-well region (potential Vss) and source and drain regions as the other electrode of the capacitive element, and using the gate-insulating film as a dielectric film of the capacitive element. Moreover, a capacitive element is constituted by electrically connecting the power-source line Vss to the gate electrode of a pMISFET, thereby using the gate electrode as one electrode of the capacitive element, using an n-well region (potential Vdd) and source and drain regions as the other electrode of the capacitive element, and using the gate-insulating film as a dielectric film of the capacitive element. This countermeasure has the advantage that a comparatively are stabilizing capacitor can be obtained because a dedicated capacity cell is set in a semiconductor integrated circuit device.

However, because this countermeasure requires a dedicated capacitive element for stabilizing a power source, an excessive area for forming the capacitive element is necessary and thus, the problem is that improvement of the integration density is prevented. Moreover, as shown in FIG. 34B, because the position for forming the capacitive cell C is restricted to a specific position in the chip, the capacitive cell is formed at a position which is separate from an area such as a logical block R generating AC noises, that is, an area requiring a stabilizing capacitor. Therefore, the AC-noise generating position is different from the stabilization-pack forming position, and thereby, it may not be possible to effectively remove noises.

When a semiconductor integrated circuit device is a gate array circuit, a countermeasure is provided of using an unused basic cell as a capacitive element (MIS capacitive element) and connecting the basic cell between power-source lines. That is, as shown in FIG. 35B, the second means uses a countermeasure of using an MISFET constituting the basic cell as a stabilization capacity. FIGS. 35A and 35B are other illustrations which explain problems in the present invention, in which FIG. 35A is a plan view showing a semiconductor integrated circuit device in which a gate array is formed in the internal area, and FIG. 35B is a plan view showing a basic cell of the gate array. In the case in which the semiconductor integrated circuit device uses a gate array system, a capacitive element (MIS capacitive element) which is the same as the capacitive element (MIS capacitive element) shown in FIGS. 34C and 34D is constituted by using an unused basic cell instead of using a dedicated capacitive cell as in the case of the cell based IC (CBIC). According to this countermeasure, because an unused basic cell is used, an excessive area (overhead of area) for a stabilizing capacitor is unnecessary and, therefore, this countermeasure is advantageous for improving the integration degree, though excessive wirings (overhead of wiring) are increased.

However, because this countermeasure uses an existing basic cell as shown in FIG. 35B, a gate-electrode length L is generally small, and it is difficult to obtain a large stabilizing capacitor because the capacity per MOS transistor is small. Because the forming position of a basic cell that can be used as a stabilizing capacitor is restricted to a specific position in a chip, it is not always possible to set the basic cell near an area generating AC noises. Therefore, an AC-noise generating position is different from a stabilizing-capacitor forming position, and it may not be possible to effectively remove noises.

It is an object of the present invention to provide a structure of a semiconductor integrated circuit device and a method of manufacturing a semiconductor integrated circuit device capable of obtaining a large stabilizing capacitor without increasing areas or wirings.

It is another object of the present invention to add a large stabilizing capacitor between power-source lines (Vdd and Vss), reduce AC noises, and improve the operational stability and operational reliability of a semiconductor integrated circuit device.

It is still another object of the present invention to provide an arrangement capable of uniformly arranging stabilizing capacitors in a chip, that is, to provide an arrangement capable of effectively removing local AC noises by the stabilizing capacitors arranged near the portion generating the noises and thereby further improving the stability of a semiconductor integrated circuit device.

The above and other objects and novel features of the present invention will become more apparent from the description of this specification and the accompanying drawings.

DISCLOSURE OF INVENTION

Outlines of typical aspects of the present invention are briefly described below.

1. A semiconductor integrated circuit device of the present invention comprises a plurality of wiring layers including an optional first wiring layer except the uppermost layer and an optional second wiring layer on the first wiring layer, wherein: a capacitive element is formed in the intersectional area between a first power-source wiring having a first potential included in the first wiring layer and a second power-source wiring having a second potential included in the second wiring layer.

2. The semiconductor integrated circuit device according to the above Item 1, wherein: capacitive elements are formed to be distributed in an element-forming area of a semiconductor substrate.

3. The semiconductor integrated circuit device according to the above Item 1 or 2, wherein: first power-source wirings and second power-source wirings are formed like meshes when viewed from the top and capacitive elements are formed at intersections between the meshes.

4. The semiconductor integrated circuit device according to any one of the above Items 1 to 3, wherein: first and second wiring layers are arranged at an upper layer among a plurality of wiring layers.

5. The semiconductor integrated circuit device according to any one of the above Items 1 to 4, wherein: a capacitive element is constituted by a first power-source wiring serving as one electrode, a conductive member serving as the other electrode and formed below a second power-source wiring integrally with or by being electrically connected with the second power-source wiring, and a dielectric film formed between the both electrodes, and the thickness of the dielectric film is smaller than the thickness of a layer-insulting film between first and second wiring layers.

6. The semiconductor integrated circuit device according to any one of the above Items 1 to 4, wherein: a capacitive element is constituted by a first power-source wiring serving as one electrode, a conductive member serving as the other electrode and formed below a second power-source wiring integrally with or by being electrically connected with the second power-source wiring, and a dielectric film formed between the both electrodes, and the permittivity of the dielectric film is higher than the permittivity of a layer-insulting film between first and second wiring layers.

7. The semiconductor integrated circuit device according to the above Item 5 or 6, wherein: a dielectric film is a laminated film constituted by a tantalum oxide film, a silicon nitride film or a tantalum oxide film, and a silicon nitride film.

8. The semiconductor integrated circuit device according to any one of the above Items 5 to 7, wherein: a conductive member is formed in the same process as a connecting member for electrically connecting first and second wiring layers each other.

9. The semiconductor integrated circuit device according to any one of the above Items 5 to 8, wherein: a conductive member is formed integrally with a second power-source wiring by the dual damascene method.

10. The semiconductor integrated circuit device according to any one of the above Items 5 to 9, wherein: a conductive member is formed by embedding it in a hole formed on a interlayer dielectric film for insulating first and second wiring layers from each other.

11. The semiconductor integrated circuit device according to any one of the above Items 5 to 10, wherein: the width of an area in which the surface of a first power-source wiring is faced with the bottom of a conductive member to constitute a capacitive element is larger than widths of first and second power-source wirings.

12. The semiconductor integrated circuit device according to any one of the above Items 1 to 11, wherein: first and second wiring layers are arranged on an upper layer among a plurality of wiring layers and widths of power-source wirings arranged on a lower layer among the wiring layers are smaller than the widths of the first and second power-source wirings.

13. A semiconductor integrated circuit device manufacturing method of the present invention is a method of manufacturing a semiconductor integrated circuit device having a plurality of wiring layers and including an optional first wiring layer except the uppermost layer among the wiring layers and an optional second wiring layer upper than the first wiring layer and comprises (a) a step of forming a interlayer dielectric film for covering the first wiring layer and forming holes on a interlayer dielectric film on a wiring constituting the first wiring layer and forming holes in said interlayer dielectric film on said wiring layer constituting said first wiring layer, (b) a step of forming a mask film for covering some of the holes, (c) a step of etching the mask film and removing an insulating film formed on a interlayer dielectric film including bottoms or inside faces of the holes, and (d) a step of removing the mask film and forming a conductive member in the holes.

14. The semiconductor integrated circuit device manufacturing method according to the above Item 13, wherein: an insulating film is formed in either of a step of forming the insulating film on a first wiring layer before forming a interlayer dielectric film and a step of forming holes on the interlayer dielectric film and then forming the insulating film on the entire surface of the interlayer dielectric film including the inside faces of the holes.

15. The semiconductor integrated circuit device manufacturing method according to the above Item 13 or 14, wherein: a conductive member is formed in either of a step of forming the conductive member integrally with a wiring constituting a second wiring layer and a step of forming a conductive film for filling up holes and then forming the conductive member by removing the conductive film from a interlayer dielectric film other than the holes.

16. A semiconductor integrated circuit device manufacturing method of the present invention is a method of manufacturing a semiconductor integrated circuit device having a plurality of wiring layers and including an optional first wiring layer except the uppermost layer among the wiring layers and an optional second wiring layer higher than the first wiring layer and comprises (a) a step of depositing a first insulating film, a second insulating film, and a third insulating film on the first wiring layer in order, (b) a step of patterning a fist mask film having an opening in an area in which holes will be formed on the third insulating film and etching the first insulating film under presence of the first mask film, (c) a step of removing the first mask film and depositing a fourth insulating film and a fifth insulating film in order on the third and second insulating films, (d) a step of patterning a second mask film having an opening in an area in which trenches will be formed on the fifth insulating film and etching the fifth insulating film under presence of the second mask film, (e) a step of etching the fourth insulating film by using the second mask film or the fifth insulating film as a mask, forming the trenches pattered on the fifth insulating film on the fourth insulating film, and moreover etching the second insulating film by using the third insulating film as a mask and forming the holes patterned on the third insulating film on the second insulating film, (f) a step of removing the third and first insulating films exposed to bottoms of the trenches and holes, (g) a step of depositing a sixth insulating film on the entire surface of a semiconductor substrate including inside faces of the trenches and holes, (h) a step of patterning a third mask film for covering some of the holes, (i) a step of etching the sixth insulating film under presence of the third mask film, (j) a step of removing the third mask film and forming a conductive film for filling up the trenches and holes, and (k) a step of removing conductive films in areas other than the trenches and forming a wiring and a conductive member constituting the second wiring layer.

17. A semiconductor integrated circuit device manufacturing method of the present invention is a method of manufacturing a semiconductor integrated circuit device having a plurality of wiring layers and including an optional first wiring layer except the uppermost layer among the wiring layers and an optional second wiring layer higher than the first wiring layer and comprises (a) a step of depositing a first insulating film, a second insulating film, and a third insulating film on the first wiring layer in order, (b) a step of patterning a first mask film having an opening in an area in which holes will be formed on the third insulating film and etching the first insulating film under presence of the first mask film, (c) a step of removing the first mask film and depositing a fourth insulating film and a fifth insulating film in order on the third and second insulating films, (d) a step of patterning a second mask film having an opening in an area in which trenches will be formed on the fifth insulating film and etching the fifth insulating film under presence of the second mask film, (e) a step of etching the fourth insulating film by using the second mask film or the fifth insulating film as a mask, forming the trenches patterned on the fifth insulating film on the fourth insulating film, and moreover etching the second insulating film by using the third insulating film as a mask and forming the holes patterned on the third insulating film on the second insulating film, (f) a step of patterning a third mask film for covering some of the holes, (g) a step of etching the first insulating film at hole bottoms and the third insulating film at trench bottoms under presence of the third mask film and the patterned fifth insulating film, (h) a step of removing the third mask film and forming a conductive film for filling up the trenches and holes, and (i) a step of removing the conductive film and forming a wiring and a conductive member constituting the second wiring layer.

18. A semiconductor integrated circuit device manufacturing method of the present invention is a method of manufacturing a semiconductor integrated circuit device having a plurality of wiring layers and including an optional first wiring layer except the uppermost layer among the wiring layers and an optional second wiring layer higher than the first wiring layer and comprises (a) a step of depositing a first insulating film, a second insulating film, a third insulating film, a fourth insulating film, and a fifth insulating film on the first wiring layer in order, (b) a step of patterning a first mask film having an opening in an area in which holes will be formed on the fifth insulating film, etching the fifth, fourth, third, and second insulating films under presence of the first mask film, and forming holes, (c) a step of removing the fist mask film, then forming a second mask film on the fifth insulating film, exposing an area in which trenches will be formed and then developing the second mask film, and leaving the second mask film in areas other than the area in which trenches will be formed and the holes, (d) a step of etching the fifth and fourth insulating films under presence of the second mask film and forming trenches, (e) a step of removing the second mask film and patterning a third mask film for covering some of the holes, (f) a step of etching the first insulating film at hole bottoms under presence of the third mask film, (g) a step of removing the third mask film and forming a conductive film for filling up the trenches and holes, and (h) a step of removing the conductive film in areas other than the trenches and forming a wiring and a conductive member constituting the second wiring layer.

19. The semiconductor integrated circuit device manufacturing method according to the above Item 17 or 18, further comprises a step of depositing a sixth insulating film on the entire surface of a semiconductor substrate including inside faces of trenches and holes before forming a third mask film, wherein: a sixth insulating film not covered with the third mask film is removed together with a first insulating film at hole bottoms in a step of etching the first insulating film.

20. A semiconductor integrated circuit device manufacturing method of the present invention is a method of manufacturing a semiconductor integrated circuit device having a plurality of wiring layers and including an optional first wiring layer except the uppermost layer among the wiring layers and an optional second wiring layer higher than the first wiring layer and comprises (a) a step of depositing a seventh insulating film for covering the first wiring layers (b) a step of patterning a first mask film having an opening in an area in which holes will be formed on the seventh insulating film, etching the seventh insulating film under presence of the first mask film, and removing the seventh insulating film on a wiring constituting the first wiring layer, (c) depositing a sixth insulating film on the entire surface of a semiconductor substrate including inside faces of the holes, (d) a step of patterning a third mask film for covering some of the holes, (e) a step of etching the sixth insulating film under presence of the third mask film, (f) a step of removing the third mask film and forming a conductive film for filling up the holes, (g) a step of removing the conductive film in the area other than the holes and forming a conductive member to be connected to a wiring constituting the second wiring layer, and (h) a step of depositing a second conductive film on the entire surface of the semiconductor substrate, patterning the second conductive film, and forming the second wiring layer.

21. The semiconductor integrated circuit device manufacturing method according to any one of the above Items 16 to 20, wherein: first and third insulating films are constituted by a material having an etching selection ratio for second and fourth insulating films and the first insulating film has the same thickness as the third insulating film.

22. The semiconductor integrated circuit device manufacturing method according to any one of the above Items 16 to 21, wherein: a first or sixth insulating film has a thickness smaller than that of a second insulating film.

23. The semiconductor-integrated-circuit-device manufacturing method according to any one of the above Items 16 to 22, wherein: a first or sixth insulating film has a permittivity higher than that of a second insulating film.

24. A method of generating a mask-pattern of the present invention is used for a method of manufacturing a semiconductor integrated circuit device having a plurality of wiring layers and including an optional first wiring layer except the uppermost layer among the wiring layers and an optional second wiring layer higher than the first wiring layer and comprises a first step of determining the intersectional area where a first power-source wiring a first power-source wiring to which a first potential is assigned among power-source wirings constituting the first wiring layer intersects with a second power-source wiring to which a second potential different from the first potential is assigned among power-source wirings constituting the second wiring layer, a second step of generating a hole pattern in the intersectional area, and a third step of increasing the width of the hole pattern so as not to reach the wiring areas of the fist and second wiring layers adjacent to the hole pattern.

25. The semiconductor integrated circuit device according to any one of the above Items 1 to 12, having a capacitive cell.

26. The semiconductor integrated circuit device according to any one of the above Items 1 to 12, wherein: a second wiring layer is the uppermost wiring layer.

27. The semiconductor integrated circuit device according to any one of the above Items 1 to 4, wherein: a capacitive element is constituted by a first power-source wiring serving as one electrode, a conductive member serving as the other electrode formed integrally with or by electrically connecting with a second power-source wiring below the second power-source wiring, and a dielectric film formed between the both electrodes, and a interlayer dielectric film between first and second wiring layers includes an insulating film having a permittivity lower than that of the dielectric film.

28. The semiconductor integrated circuit device according to any one of the above Items 1 to 12 or 25 to 27, wherein: capacitive elements are distributed on a memory block and a logical block.

29. The semiconductor integrated circuit device according to the above Item 25, wherein: a capacitive cell constitutes an MIS capacitive element.

30. The semiconductor integrated circuit device according to any one of the above Items 1 to 12 or 25 to 29, wherein: a hole is formed in an intersectional area by using a step of forming a connective hole for electrically connecting a first wiring layer with a second wiring layer and a conductive member formed in the hole is electrically connected with a second power-source wiring and works as one electrode of the capacitive element, and a first power-source wiring works as the other electrode of the capacitive element.

Among the aspects of the present invention disclosed above, advantages obtained from typical aspects are briefly described below.

(1) It is possible to realize a semiconductor integrated circuit device capable of obtaining a large power-source stabilizing capacitor without increasing areas or wirings.

(2) It is possible to improve the operational stability and operational reliability of a semiconductor integrated circuit device by adding a large stabilizing capacitor between power-source lines (Vdd and Vss) and reducing AC noises.

(3) It is possible to uniformly arrange stabilizing capacitors in a chip and effectively remove noises by use of the stabilizing capacitors arranged nearby a portion where local AC noises are generated. Thereby, it is possible to further improve the stability of a semiconductor integrated circuit device.

BRIEF DESCRIPTION OF THE DRAWINGS

FIGS. 1A and 1B are plan views showing a semiconductor integrated circuit device of an embodiment of the present invention, in which FIG. 1A is a plan view showing the whole of a chip and FIG. 1B is an enlarged plan view of part of the internal area;

FIGS. 33A to 33C are plan views showing a pattern generation method of another embodiment of the present invention;

FIGS. 34A to 34D are illustrations which explain the problems dealt with in the present invention, in which FIG. 34A is a plan view of a semiconductor integrated circuit device with a standard cell formed in the internal area, FIG. 34B is an enlarged plan view showing a capacitive cell area, FIG. 34C is an enlarged view showing a capacitive cell, and FIG. 34D is a sectional view taken along the line d–d' in FIG. 34C;

FIGS. 35A and 35B are other illustrations which explain problems dealt with in the present invention, in which FIG. 35A is a plan view of a semiconductor integrated circuit device with a gate array formed in the internal area, and FIG. 35B is a plan view showing a basic cell of the gate array.

BEST MODE FOR CARRYING OUT THE INVENTION

Embodiments of the present invention are described below by referring to the accompanying drawings. In all illustrations explaining the embodiments, the same members are provided with the same symbols and repetitive descriptions are omitted.

Embodiment 1

Figure 1B:
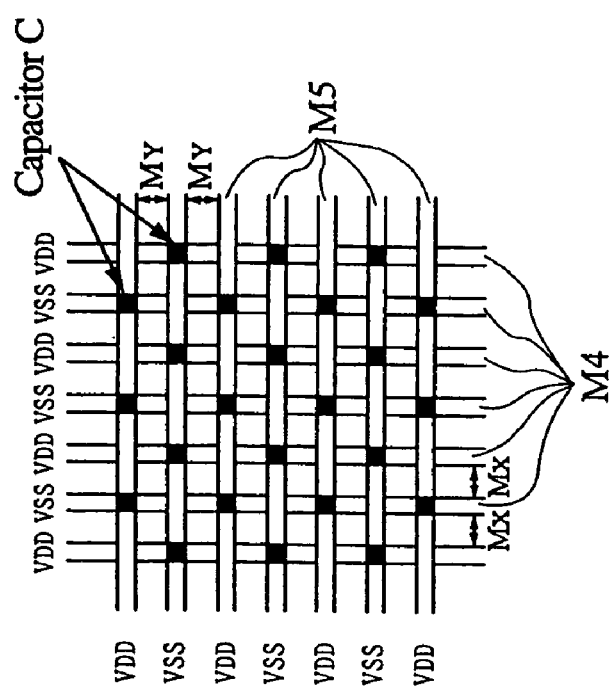
Figure 1A:
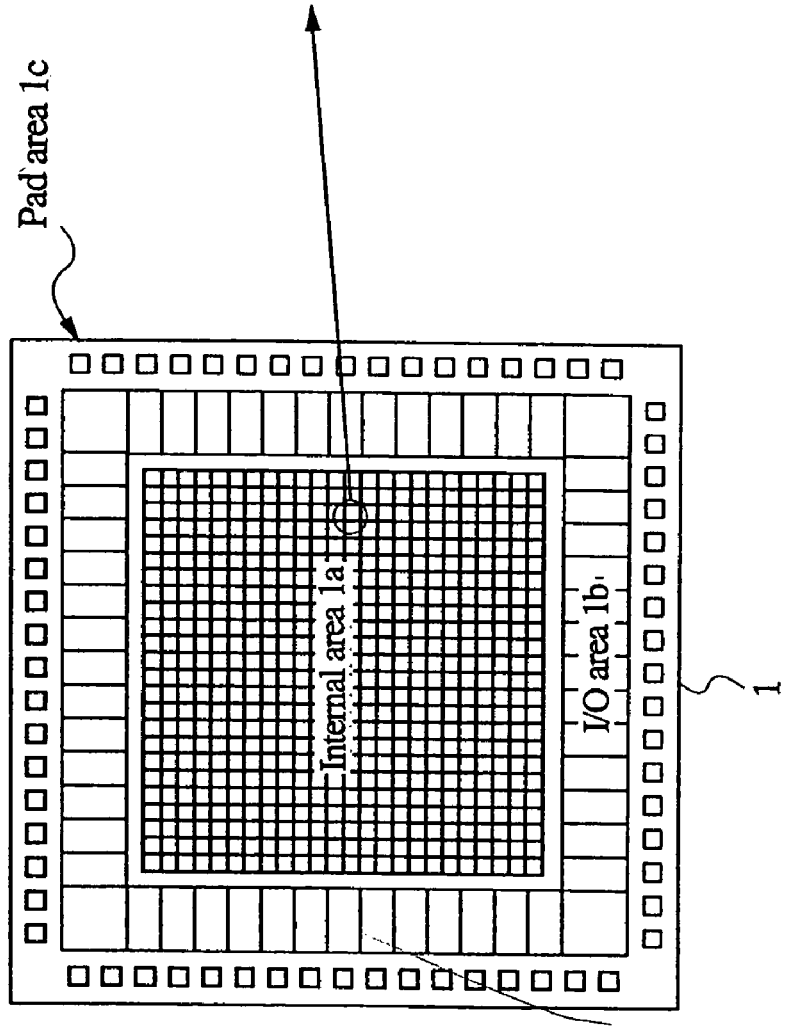

FIGS. 1A and 1B are plan views showing a semiconductor integrated circuit device of an embodiment of the present invention, in which FIG. 1A is a plan view showing an entire chip and FIG. 1B is an enlarged view of part of the internal area.

As shown in FIG. 1A, in the case of the semiconductor integrated circuit device of this embodiment, an internal area 1a is formed at the central portion of a semiconductor substrate 1, an input/output-control I/O area 1b is formed around the area 1a, and a lead-takeout pad (external terminal) 1c is set at the circumference of the I/O area 1b. A logic circuit, a memory circuit (a memory block), and a dock circuit such as a RAM (Random Access Memory) or a ROM (Read Only Memory) are arranged in the internal area 1a, and an input/output circuits are arranged in the I/O area 1b. The logic circuit, memory circuit, and input/output circuits are constituted by basic cells constituted by semiconductor devices, and the basic cells and semiconductor devices are connected to each other by wirings. A wiring layer is formed on an upper layer of the internal area 1a. FIG. 1B shows the fifth wiring layers M5, which are the uppermost layers, and the fourth wiring layers M4, which are lower than the layers M5. Though a five-layer wiring in which the fifth wiring layers M5 are the uppermost layers is shown in the case of this embodiment, it is permitted to use a wiring layer of five layers or more or a wiring layer of four layers or less. However, because a multilayer wiring is required, it is necessary to use a wiring structure of two layers or more.

As shown in FIG. 1B, among wirings constituting the fifth wiring layers M5, for example, the first potential Vss or second potential Vdd is assigned to power-source wirings so as to have a predetermined interval My. Moreover, the first potential Vss or second potential Vdd is also assigned to power-source wirings constituting the fourth wiring layers M4, so as to have a predetermined interval Mx. In FIG. 1B, wirings other than power-source wirings are omitted so that the drawing can be easily seen. Moreover, the first potential Vss is set, for example, to 0 V, and that is the reference potential and the second potential Vdd is set, for example, to 1.5 to 3.3 V higher than the reference potential.

Moreover, as shown in FIG. 1B, the fifth wiring layers M5 and the fourth wiring layers M4 are constituted like meshes. A power-source-stabilizing capacitor (capacitive element) C is formed at portions where wirings to which the first potential Vss of the fifth wiring layers M5 is assigned intersect with wirings to which the second potential Vdd of the fourth wiring layers M4 is assigned, as well as at portions where wirings to which the second potential Vdd of the fifth wiring layers M5 is assigned intersect with wiring to which the first potential Vss of the fourth wiring layers M4 is assigned. In the case of this embodiment, as shown in FIG. 1B, capacitors C are uniformly distributed in at least the internal area 1a of the semiconductor substrate 1 (chip) when viewed from the top. That is, capacitive elements C are almost uniformly distributed in all areas of the internal area 1a. Therefore, power consumption is locally increased in an optional area of the internal area 1a. If a factor for causing instability of a power-source voltage occurs, capacitors C nearby the factor effectively work, and, thereby, it is possible to quickly stabilize the power-source voltage and effectively suppress AC noises.

Figure 2:
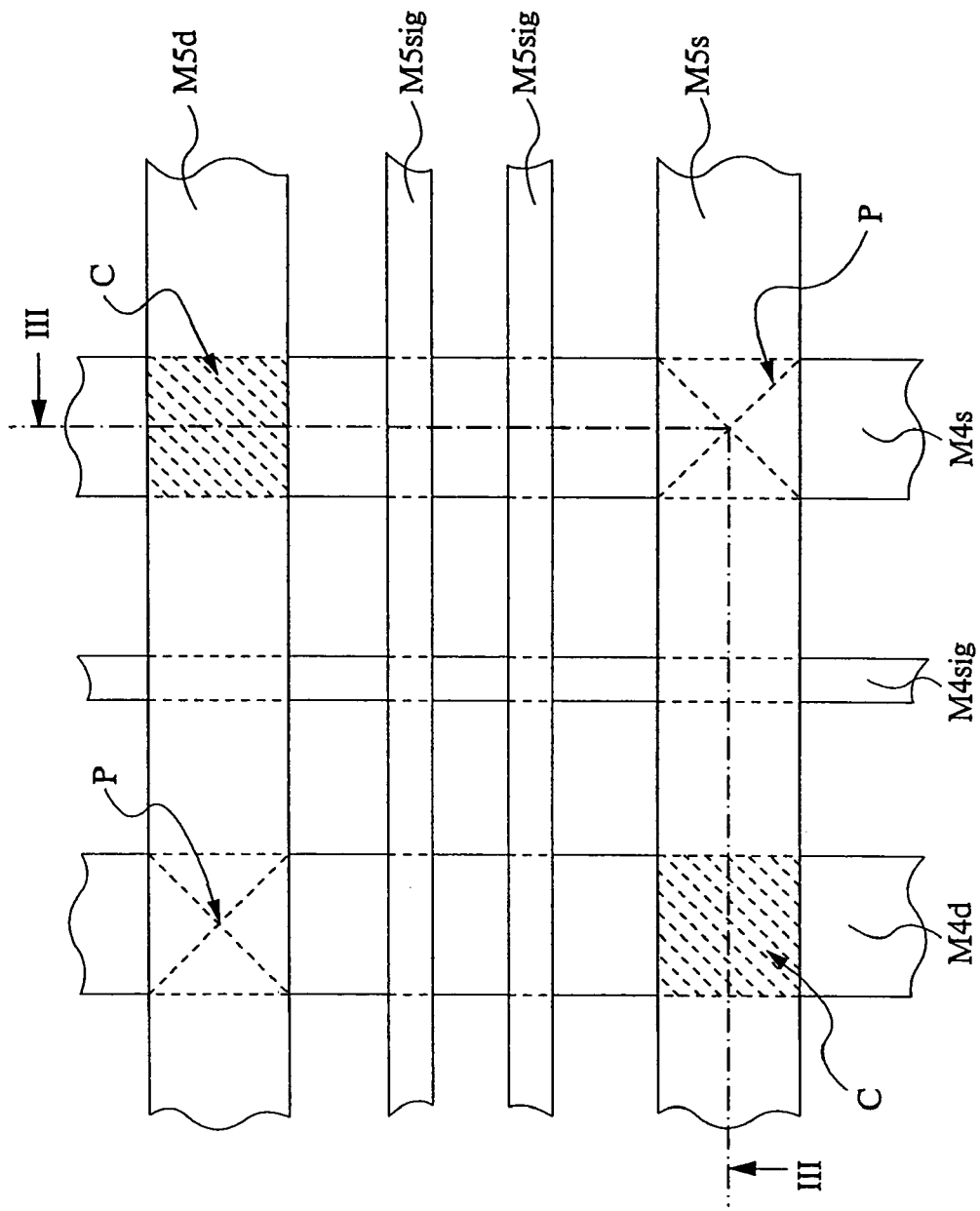
FIG. 2 is a further enlarged plan view of the internal area in FIG. 1B.
Figure 3:
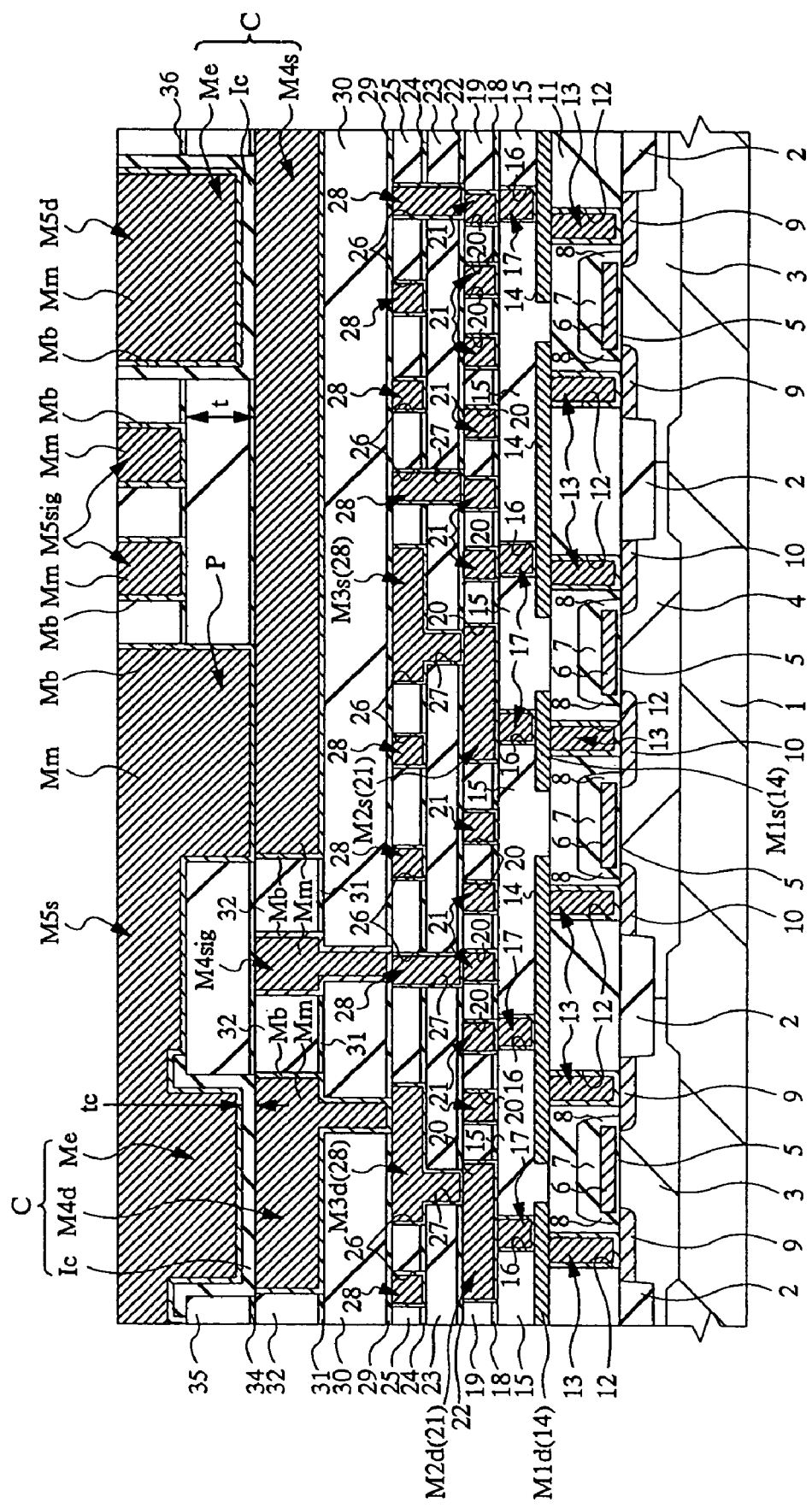
FIG. 3 is a sectional view taken along the line III—III in FIG. 2.

FIG. 2 is a further-enlarged plan view of the internal area in FIG. 1B, and FIG. 3 is a sectional view taken along the line III—III in FIG. 2.

A wiring m5s to which the first potential Vss is assigned, a wiring m5d to which the second potential Vdd is assigned, and a signal wiring M5sig to which a signal is assigned are formed on the fifth wiring layer M5 as the above power-source wirings. A wiring m4s to which the first potential Vss is assigned, a wiring m4d to which the second potential Vdd is assigned, and a signal wiring M4sig to which a signal is assigned are formed on the forth wiring layer M4 as the above power-source wirings.

A connecting member P is formed on the portion where the wiring m5s intersects with the wiring m4s and on the portion where the wiring m5d intersects with the wiring m4d, respectively, and the upper and lower layers are electrically connected to each other through the connecting member R As shown in FIG. 3, the connecting member P is formed integrally with the wiring m5s, and, therefore, the member P can be used as a conductive member formed by the so-called dual damascene method.

Each capacitor C is formed on the portion where the wiring m5s intersects with the wiring 4Md and at the portion where the wiring m5d intersects with the wiring m4s. Each capacitor C uses a conductive member Me formed integrally with the wiring m5s or wiring m5d as one electrode, and the wiring m4d or wiring m4s as the other electrode. Moreover, a capacitor-insulating film 1c serving as a dielectric film is formed between both electrodes (conductive member Me and wiring m4d or m4s), and both electrodes are insulated from each other by the capacitor-insulating film 1c. Thereby, a capacitor C is constituted.

Wirings (wirings m5s, m5d, m4s, and m4d, and signal wirings M5sig and M4sig) constituting the fifth wiring layer M5 and fourth wiring layer M4 are formed in the trenches of a wiring-forming insulating film and constituted by a main conductive layer Mm and a barrier layer Mb. The main conductive layer Mm is made of copper (Cu) and the barrier layer Mb is can be made of titanium nitride (TiN). The barrier layer Mb is formed to prevent copper from diffusing from the main conductive layer. Moreover, the connecting member P and conductive member Me are formed in holes which are formed at the bottoms of the wirings integrally with the above wirings m5s and m5d. The connecting member P and conductive member Me are also constituted by the main conductive layer Mm and barrier layer Mb, and the main conductive layer Mm is made of copper and the barrier layer Mb is made of titanium nitride.

The capacitor-insulating film 1c is made, for example, of tantalum oxide (TaOx). Because tantalum oxide has a large relative permittivity of 20 or more, it is possible to secure a large enough capacitance value of the capacitor C. Because the thickness tc of the capacitor-insulating film 1c is smaller than the thickness t (t<tc) of the interlayer dielectric film between the fifth wiring layer M5 and fourth wiring layer M4, on which the connecting member P and conductive member Me are formed, it is possible to secure a large enough capacitance value.

It is possible to use material having a low permittivity as the materials for a wiring-forming insulating film and a interlayer dielectric film. For example, it is possible to use a silicon-oxide film as the main material. By insulating wirings from each other by using a low-permittivity material, it is possible to decrease the capacitance between wirings and improve the signal transmission rate.

Thus, in the case of this embodiment, it is possible to retain the high quality of the response rate (signal transmission rate) to a signal by using a low-permittivity material such as a low-permittivity SOG (Spin On Glass) film or silicon-oxide film for insulation between wirings, stabilize a power-supply voltage, and remove AC noises by using a high-permittivity material such as tantalum oxide as the material of the capacitor-insulating film 1c and by increasing the capacity between power-source wirings having different voltages from each other in order to decrease the thickness of the capacitor-insulating film 1c.

Moreover, because a capacitor C of this embodiment is formed between power-source wirings having different voltages from each other between wiring layers different from each other, it is unnecessary to separately set a capacitive cell to the semiconductor substrate 1. Therefore, there is no area overhead for forming a power-source-stabilizing capacitor, and this is advantageous for improvement in integration degree. Moreover, it is unnecessary to form an excessive wiring to be connected to a power-source stabilizing capacitor, and it is possible to prevent wiring overhead.

Furthermore, a capacitor C of this embodiment has a structure capable of securing a large capacitance value as described above, and it is unnecessary to be anxious about the deficiency of a capacitance value as in the case of constituting a capacitor by making use of an unused basic cell of a gate array. That is, it is possible to suppress the overhead of areas and wirings and to secure a large power-source-stabilizing capacitor.

Moreover, because the capacitors C of this embodiment are uniformly distributed over almost the entire chip (semiconductor substrate 1), even if power consumption locally increases and a factor of voltage instability (AC noises) occurs, it is possible to quickly stabilize the factor by capacitors C that are near the factor and effectively suppress AC noises.

The power-source wirings m5d and m5s and the signal wiring M5sig formed on the fifth wiring layer M5 are arranged so as to mainly extend in the X direction (first direction), and the power-source wirings m4d and m4s and the signal wiring M4sig formed on the fourth wiring layer M4 are arranged so as to mainly extend in the Y direction (second direction) to be intersected with the X direction. Moreover, power-source wirings m3d and m3s and the signal wiring M3sig formed on a third wiring layer M3 are arranged so as to mainly extend in the X direction and power-source wirings m2d and m2s and the signal wiring M2sig formed on a second wiring layer M2 are arranged so as to mainly extend in the Y direction. Power-source wirings m1d and m1s and the signal wiring M1sig are formed on a first wiring layer M1, and the power-source wirings m1d and m1s are arranged so as to mainly extend in the X direction. The power-source wiring m1s is electrically connected to the source region of an n-channel MISFET Qn, and the power-source wiring m1d is electrically connected to the source region of a p-channel MISFET Qp. The power-source wirings m5d, m4d, m3d, m2d, and m1s are electrically connected to each other, and the second potential Vdd is supplied from the power-source wirings m1d. The power-source wirings m5s, m4s m3s, m2s and m1s are electrically connected to each other, and the first potential Vss is supplied from the power-source wiring m5s to the power-source wiring m1s. The inside of a basic cell is mainly connected by a signal wiring M1sig and basic cells are mainly connected to each other by the signal wirings M1sig, M2sig, M3sig, M4sig, and M5sig.

In the case of this embodiment, the power-source wirings m5d and m5s formed on the fifth wiring layer M5 and the power-source wirings m4d and m4s formed on the fourth wiring layer M4, which are upper layers, have wiring widths larger than those of the lower layers, namely, the power-source wirings m1d and m1s formed on the first wiring layer M1, the power-source wirings m2d and m2s formed on the second wiring layer M2, and the power-source wirings m3d and m3s formed on the third wiring layer M3. In the case of this embodiment, capacitors C are constituted by using the upper-layer power-source wirings m5d, m5s, m4d, and m4s having widths larger than those of the lower layers. Therefore, it is possible to increase the capacitance of a capacitor C while suppressing an increase in the number of process steps. Moreover, by decreasing the widths of the lower-layer power-source wirings m1d, m1s, m2d, m2s, m3d, and m3s and densely constituting the signal wirings m3sig, M2sig, and M1sig, it is possible to improve the versatility of connections in a basic cell and between basic cells and to improve the logic in integration degree.

Thus, by using the power-source wirings m5d, m5s, m4d, and m4s of the fifth wiring layer M5 and fourth wiring layer M4, which are upper layers and thereby, constituting capacitors C between them, it is possible to stabilize the supply of power and increase a capacitor capacitance. Moreover, it is possible to minimize an increase in the number of process steps.

This embodiment is described by using an example of five-layer wiring. However, in the case of a structure with a seven-layer wiring, it is possible to constitute capacitors C by using a seventh wiring layer M7 and a sixth wiring layer M6 as wirings of upper layers.

Thus, by constituting a capacitor C using an upper wiring layer having a large power-source-wiring width, it is possible to improve the logic in integration degree, increase the capacitance of the capacitor C, and reduce the instability of voltage (AC noises). Moreover, though two layers such as the uppermost wiring layer and the wiring layer under the uppermost wiring layer are used as upper layers for this embodiment, it is a matter of course that three layers can be used.

Furthermore, though the pad $1c$ is used for this embodiment as an external terminal, it is possible to use a structure in which a bump electrode (external terminal) electrically connected to the fifth wiring layer M5 is formed on a final passivation film on the fifth wiring layer M5. Furthermore, it is possible to form bump electrodes for a power-source wiring and a signal on the internal area $1a$.

A wiring structure of the third wiring layer or lower and a structure of an MISFET formed on the principal plane of the semiconductor substrate 1 will be described together with the description of the following manufacturing method.

FIGS. 4 to 19 are sectional views showing a method of manufacturing the semiconductor integrated circuit device of this embodiment in order of step. The method is described below in order of step by using the accompanying drawings.

Figure 4:
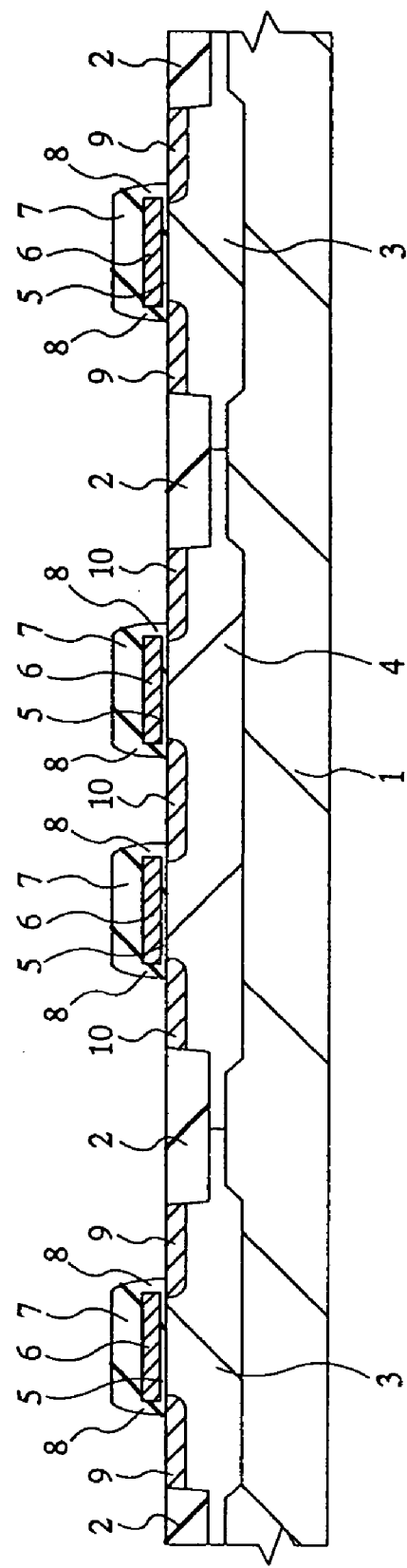
FIGS. 4 to 19 are sectional views showing a method of manufacturing a semiconductor integrated circuit device of the first embodiment in order of step.

First, as shown in FIG. 4, a semiconductor substrate 1 made of p-type single-crystal silicon is prepared to form a device separation area 2 above the principal plane of the semiconductor substrate 1. The device separation area 2 can be formed as described below. First, a silicon-oxide film (SiO) and a silicon-nitride film (SiN) are formed in order on the principal plane of the semiconductor substrate 1, and the silicon-nitride film is etched by using a patterned photoresist film to form shallow trenches on the semiconductor substrate 1 by using the etched silicon-nitride film as a mask. Then, an insulating film for filling the shallow trenches, such as a silicon-oxide film, is deposited to remove the silicon oxide film from areas other than the shallow trenches through CMP (Chemical Mechanical Polishing) and, moreover, to remove the silicon-nitride film through wet etching. Thereby, the device separation area 2 is formed.

Then, an impurity is ion-implanted by using the patterned photoresist film as a mask to form a p-well 3 and an n-well 4. An impurity showing the p-type conductivity type such as boron (B) is ion-implanted into the p-well 3, and an impurity showing the n-type conductivity type such as phosphorus (P) is ion-implanted into the n-well 4. Then, it is possible to ion-implant an impurity for controlling the threshold value of an MISFET into each well region.

Then, a silicon-oxide film serving as a gate-insulating film 5, a polysilicon film serving as a gate electrode 6, and a silicon-oxide film serving as a cap-insulating film 7 are deposited in order to form a laminated film and etch the laminated film by using a photoresist film patterned through photolithography as a mask. Thereby, the gate-insulating film 5, gate electrode 6, and cap-insulating film 7 are formed. The gate-insulating film 5 can be formed through thermal CVD and the gate electrode 6 can be formed through CVD (Chemical Vapor Deposition). To reduce the resistance value of the gate electrode 6, it is also possible to dope the gate electrode 6 with an n-type or p-type impurity in accordance with the channel type of an MISFET. That is, it is possible to dope the gate electrode of an n-channel MISFET with an n-type impurity and the gate electrode of a p-channel MISFET with a p-type impurity. In this case, it is possible to use the ion implantation. Moreover, it is possible to form above the gate electrode 6 refractory-metal sillicide films made of $WSi_x$, $MoSi_x$, $TiSi_x$, and $TaSi_x$, or form a metallic layer made of tungsten or the like through a barrier metal layer made of titanium nitride or tungsten nitride. Thereby, it is possible to reduce the sheet resistance value of the gate electrode 6 and improve the operation speed of an MISFET. It is possible to deposit the cap-insulating film 7 through CVD.

Then, a side-wall spacer 8 is formed on the side wall of the gate electrode 6 by depositing a silicon-oxide film on the semiconductor substrate 1 through CVD and then anisotropy-etching the silicon-oxide film. Then, an n-type impurity (e.g. phosphorus or arsenic) is ion-implanted into the p-well 3 by using a photoresist film as a mask to form an n-type semiconductor region 9 at both sides of the gate electrode 6 on the p-well 3. The n-type semiconductor region 9 is formed on the gate electrode 6 and side-wall spacer 8 in self-alignment. Moreover, the n-type semiconductor region 9 functions as the source and drain regions of an n-channel MISFET Qn. Moreover, a p-type semiconductor region 10 is formed at both sides of the gate electrode 6 on the n-well 4 by using a photoresist film as a mask and thereby ion-implanting a p-type impurity (e.g. boron) into the n-well 4. The p-type semiconductor region 10 is formed on the gate electrode 6 and side-wall spacer 8 in self-alignment and functions as the source and drain regions of a p-channel MISFET Qp.

Moreover, it is also possible to form the so-called LDD (Lightly Doped Drain) structure by forming the side-wall spacer 8, then forming a low-concentration-impurity semiconductor region, and then forming a high-concentration-impurity semiconductor region.

Figure 5:
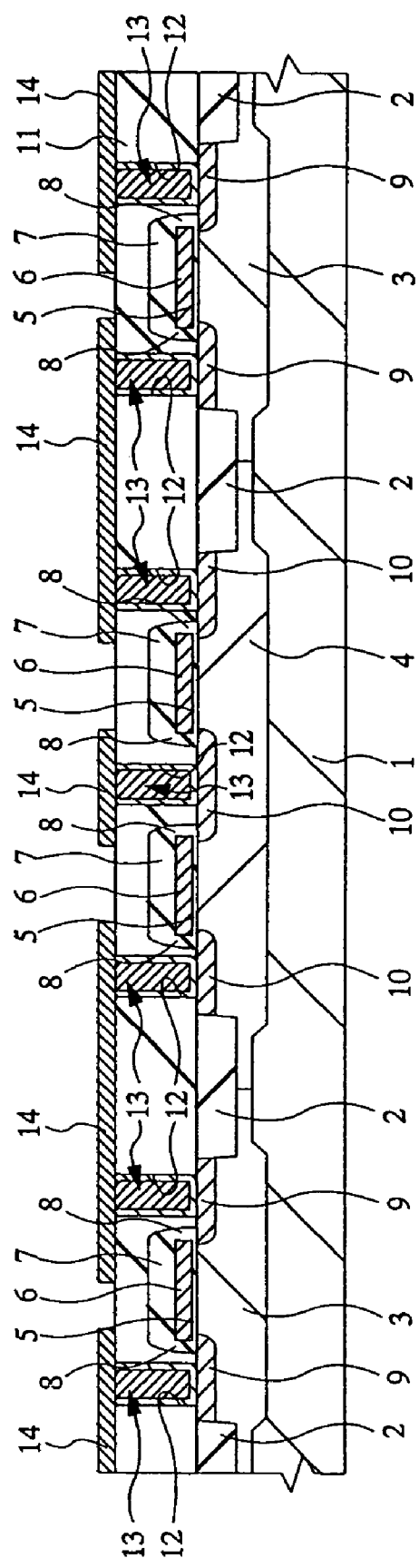

Then, as shown in FIG. 5, a first interlayer dielectric film 11, whose surface is flattened is formed by depositing a silicon-oxide film on the semiconductor substrate 1 through sputtering or CVD and then polishing the silicon-oxide film through CMP.

Then, a connective hole 12 is formed on the first interlayer dielectric film 11 through photolithography. The connective hole 12 is formed at a necessary portion on the n-type semiconductor region 9 or p-type semiconductor region 10.

Then, a plug 13 is formed in the connective hole 12 as described below. First, a titanium-nitride (TiN) film is formed on the entire surface of the semiconductor substrate 1, including the inside of the connective hole 12. The titanium-nitride film can be formed through CVD. Because CVD is superior in step coverage of a film, it is possible to form the titanium-nitride film in the fine connective hole 12 at a uniform thickness. Then, a tungsten (W) film for filling the connective hole 12 is formed. The tungsten film can be formed through CVD. CVD makes it possible to fill the connective hole 12 with tungsten. Then, the plug 13 can be formed by removing the titanium-nitride film and tungsten film from areas other than the connective hole 12 through CMP. Moreover, it is also possible to form a semiconductor substrate (n-type or p-type semiconductor region 9 or 10) at the bottom of the connective hole 12 in a sillicide film by depositing a titanium (Ti) film before forming a titanium-nitride film and heat-treating the film. By forming the above sillicide film, it is possible to reduce the contact resistance at the bottom of the connective hole 12.

Next, a tungsten film is formed on the entire surface of the semiconductor substrate 1 and patterned through photolithography to form a wiring 14 of a first wiring layer. The tungsten film can be formed through CVD or sputtering.

Figure 6:
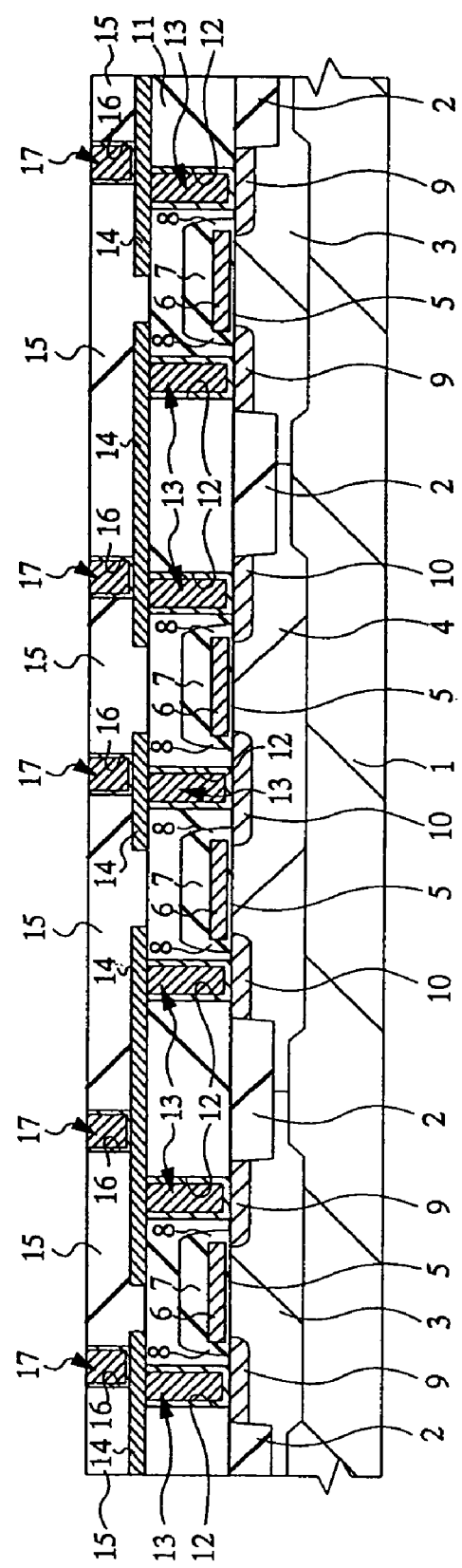

Then, as shown in FIG. 6, the insulating film is formed, for example, of silicon-oxide film for covering the wiring 14, and the insulating film is flattened by CMP to form a second interlayer dielectric film 15.

Next, a photoresist film, having an opening in an area where a connective hole is formed, is formed on a second interlayer dielectric film 15 to execute etching by using the photoresist film as a mask. Thereby, a connective hole 16 is formed in a predetermined area of the second interlayer dielectric film 15.

Then, a plug 17 is formed in the connective hole 16. The plug 17 can be formed as described below. First, a barrier layer is formed on the entire surface of the semiconductor substrate 1, including the inside of the connective hole 16, to form a copper (Cu) film for filling the connective hole 16. Then, the copper film and barrier film in areas other than the connective hole 16 are removed through CMP to form the plug 17.

A barrier layer has the capability to prevent copper from diffusing around the second interlayer dielectric film 15, and for example, a titanium-nitride film can be used as the barrier layer. It is possible to use not only the titanium-nitride film but also other metallic film, as long as the metallic film is capable of preventing copper from diffusing. For example, it is possible to use tantalum (Ta) or tantalum nitride (TaN) instead of titanium nitride. Though the barrier layer from the next step will be described below by using a titanium-nitride film, it can be substituted with tantalum or titanium nitride, as described above.

A copper film functions as a main conductive layer and it can be formed through plating. Before a plated film is formed, it is possible to form a thin copper film as a seed film through sputtering. Moreover, it is possible to form the copper film through sputtering. In this case, it is also possible to form the copper film through sputtering, and then improve the characteristic for filling a connective hole or wiring trench by flowing the copper film through heat treatment For a copper film from the next step, the case of forming the film through plating is described. In this case, it is also possible to use sputtering, as described above.

Figure 7:
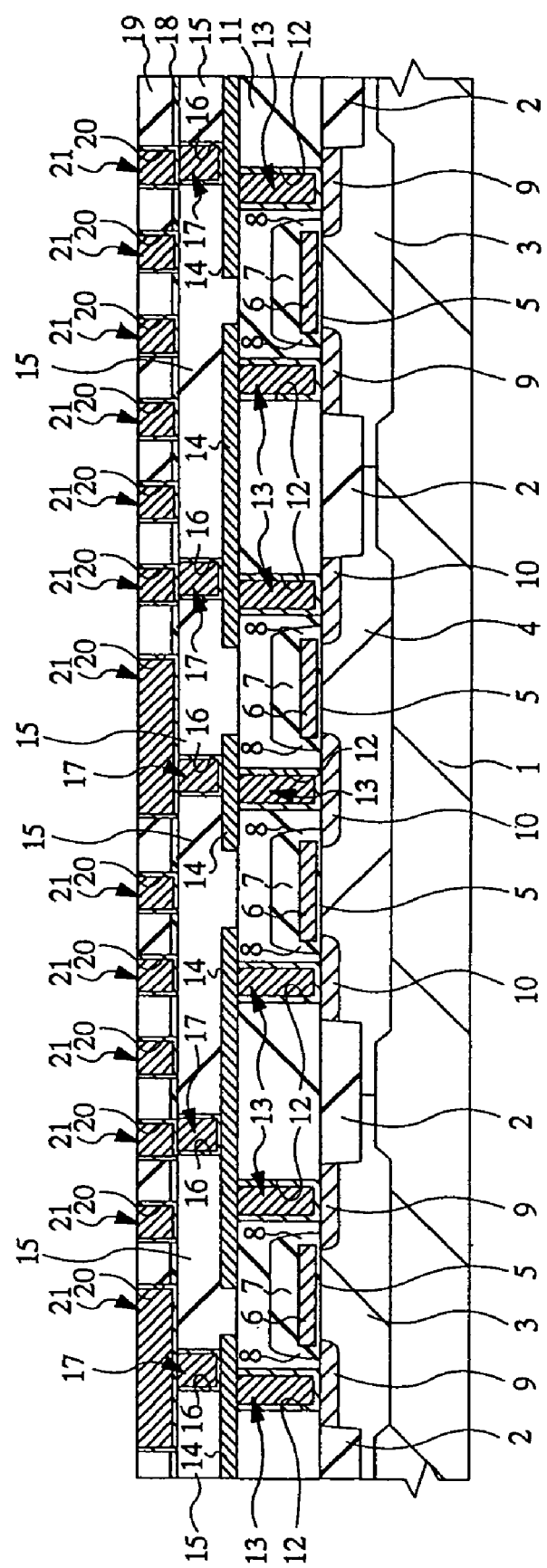

Then, as shown in FIG. 7, a stopper-insulating film 18 is formed on a second interlayer dielectric film 15, and, moreover, an insulating film 19 for forming a second wiring layer is formed. The stopper film 18 is a film serving as an etching stopper when forming trenches on the insulating film 19, and uses a material having an etching selection ratio to the insulating film 19. The stopper film 18 uses a silicon-nitride film, for example. The insulating film 19 uses a material having a small permittivity in order to decrease the capacity between wirings. The insulating film 19 uses a silicon-oxide film. A second-layer wiring, to be described later, is formed on the stopper-insulating film 18 and the insulating film 19. Therefore, the total thickness of the films 18 and 19 is decided by a designed film thickness necessary for a second wiring layer. Moreover, to reduce the capacity between wirings, i is preferable that the stopper-insulating film 18 made of a silicon-nitride film having a high permittivity has a thickness which is as small as possible, as long as the thickness of the film 18 is large enough to realize a stopper function.

Then, a photoresist film with an opening formed on a wiring pattern is patterned on the insulating film 19 to execute first etching by using the photoresist film as a mask. A part of a wiring trench 20 is formed on the insulating film 19 through the first etching. For this etching, a condition is selected in which a silicon-oxide film is easily etched but a silicon-nitride film is not easily etched. Thereby, the stopper-insulating film 18 (silicon-nitride film) is used as an etching stopper. Then, a condition for etching the silicon-nitride film is selected to execute second etching. Because the stopper-insulating film 18 has a small enough thickness, as described above, it is sufficient to perform less over-etching in the second etching, and, therefore, it is possible to suppress excessive etching of the second interlayer dielectric film 15. Thus, by using two-step etching, it is possible to uniformly and securely form the depth of the wiring trench 20.

Then, a wiring 21 for a second wiring layer is formed in the wiring trench 20. The wiring 21 is constituted by a barrier layer and a main conductive layer. The barrier layer is made of a titanium-nitride film, and the main conductive layer is made of copper. The wiring 21 is formed as described below. First, a titanium-nitride film is formed on the entire surface of the semiconductor substrate 1, including the side of the wiring trench 20, and then a copper film is made for filling the wiring trench 20. CVD is used to form the titanium-nitride film and plating is used to form the copper film. A seed film of copper can be formed through sputtering before the copper film is formed through plating. Thereafter, the wiring 21 can be formed by removing the copper film and the titanium-nitride film in areas other than the wiring trench 20 through CMP. As described above, the titanium-nitride film can be formed by using another material and the copper film can be formed by another method, such as sputtering.

Figure 8:
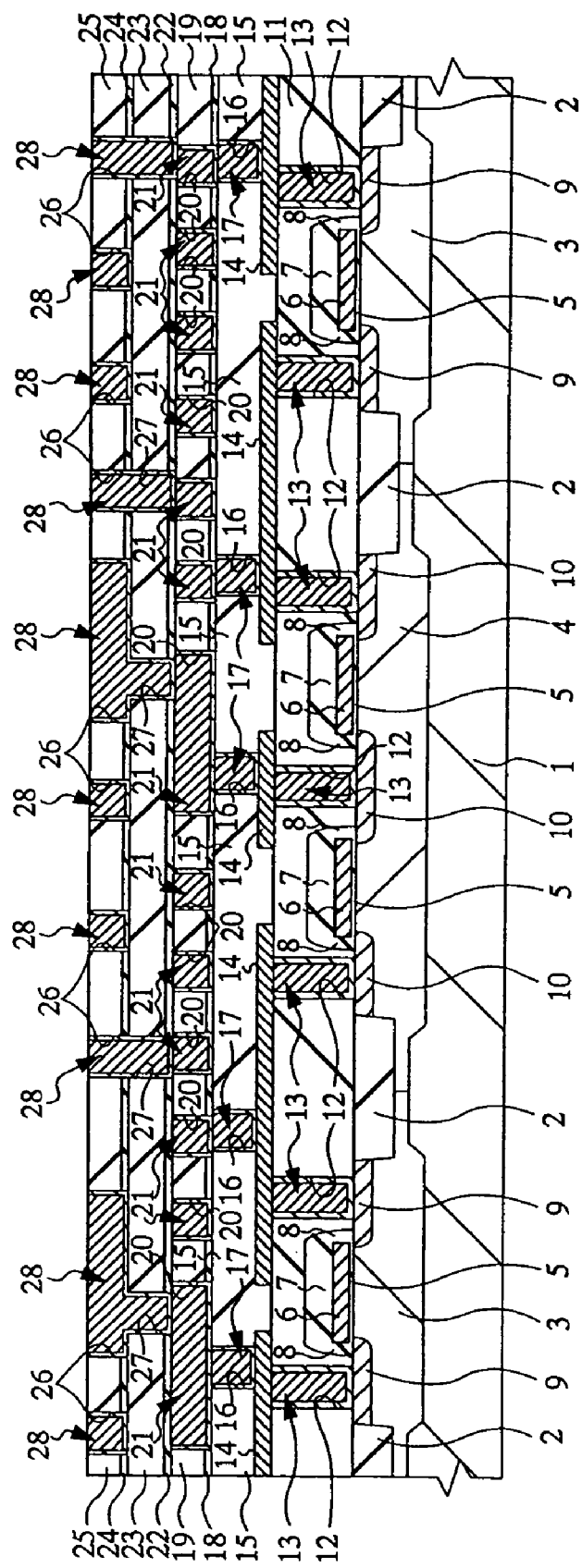

Then, as shown in FIG. 8, a stopper-insulating film 22, a interlayer dielectric film 23, a wiring-forming stopper-insulating film 24, and a wiring-forming insulating film 25 are formed in order on the wiring 21 and insulating film 19 of the second wiring layer. The stopper-insulating films 22 and 24 are constituted by a material having an etching selection ratio to the interlayer dielectric film 23 or insulating film 25. For example, it is possible to apply a silicon-nitride film to the films 22 and 24. Moreover, it is possible to apply a silicon-oxide film to the interlayer dielectric film 23 or the insulating film 25.

Then, a photoresist film with an opening formed according to the wiring pattern of the third wiring layer is pattered onto the insulating film 25 in order to etch the insulating film 25 by using the photoresist film as a mask. To execute the above etching, a condition is selected in which the silicon-nitride film is not easily etched but the silicon-oxide film is easily etched. Thereby, it is possible to etch the insulating film 25 by using the stopper-insulating film 24 as an etching stopper. Moreover, a condition for etching the silicon-oxide film is selected in order to etch the stopper-insulating film 24. Thereby, a wiring trench 26 is formed along with the wiring pattern of the third wiring layer. The fact that excessive etching of the interlayer dielectric film 23 can be suppressed by two-step etching is the same as in the case of the wiring trench 20 of the second wiring layer described above.

Then, the interlayer dielectric film 23 and stopper-insulating film 22 are etched by using the photoresist film formed along with the pattern of the connective hole for connecting the third wiring layer with the second wiring layer. This etching is executed in two steps, similarly to the above described process. When etching the interlayer dielectric film 23 (first etching), the stopper-insulating film 22 is made to function as an etching stopper and then, the stopper-insulating film 22 is etched (second etching). Thereby, a connective hole 27 is formed.

Then, a wiring 28 as the third wiring layer is formed in the wiring trench 26 and connective hole 27. A connecting member for connecting the wiring 28 with the wiring 21 serving as a lower-layer wiring is formed integrally with the wiring 28. That is, the wiring 28 is formed through the so-called dual damascene method. The method for forming the wiring 28 is described below. A titanium-nitride film serving as a barrier layer is first formed on the entire surface of the semiconductor substrate, including the insides of the wiring trench 26 and connective hole 27, through CVD, and then, a copper film for filling the wiring trench 26 and connective hole 27 is formed through plating. Then, the wiring 28 is formed integrally with a connecting member by removing, using CMP, copper film and titanium-nitride film in areas other than the wiring trench 26.

Moreover, it is possible to use the single damascene method of first forming a connecting member (plug) and then forming the wiring 28 in wiring trenches as in the case of the above second wiring layer. Though a method of forming the wiring trench 26 and then forming the connective hole 27 (trench-preceding method) has been described in the case of the above dual damascene method, it is also possible to form the wining trench 26 and connective hole 27 by a method of first forming the connective hole 27 through photolithography and then forming the wiring trench 26 through photolithography (hole-preceding method).

Figure 9:
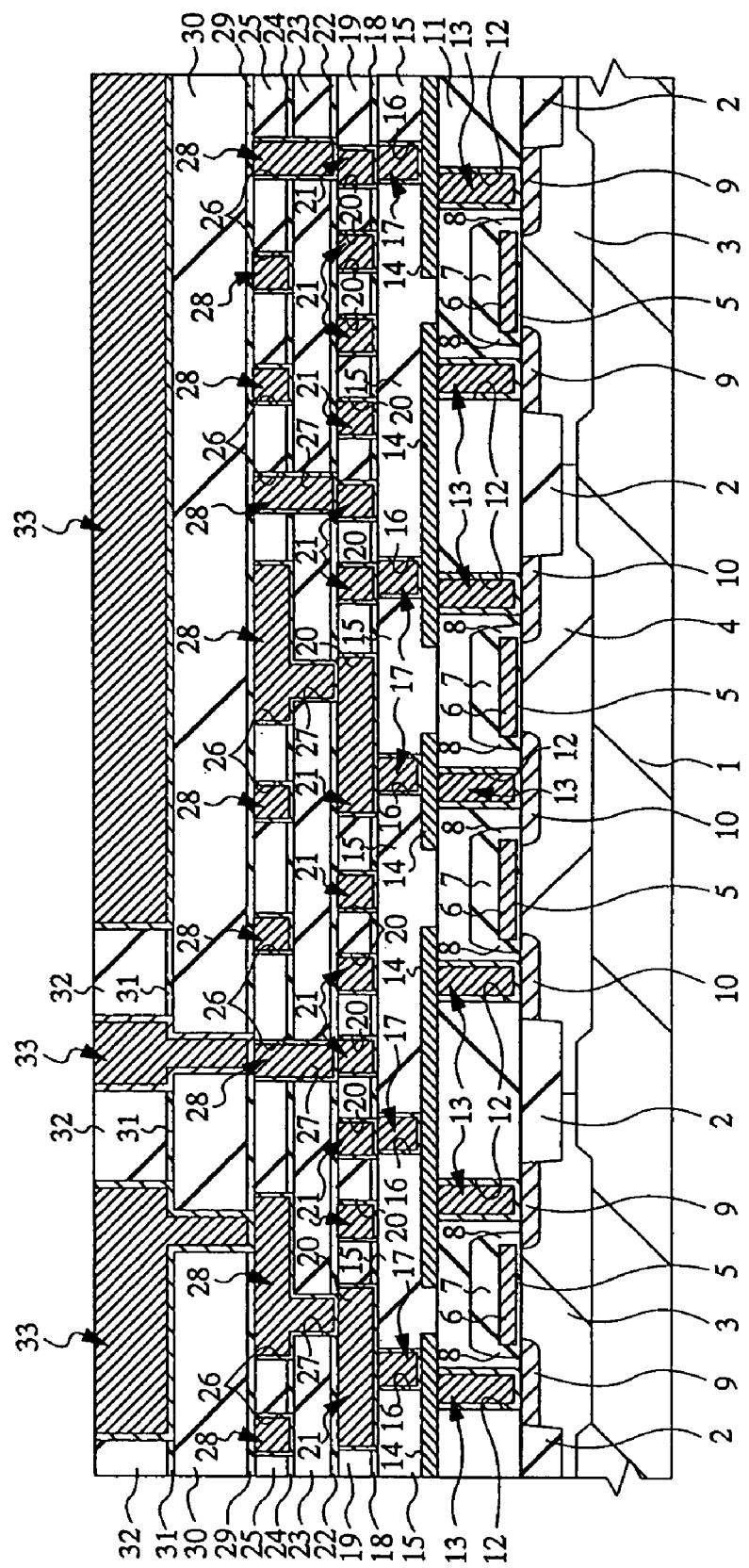

Then, as shown in FIG. 9, a stopper-insulating film 29, a interlayer dielectric film 30, a wiring-forming stopper-insulating film 31, and a wiring-forming insulating film 32 are formed in order on the insulating film 25 and wiring 28. These insulating films 29 to 32 are the same as the stopper-insulating film 22, interlayer dielectric film 23, wiring-forming stopper-insulating film 24, and wiring-forming insulating film 25. Moreover, a connective hole for a connecting member is formed on the stopper-insulating film 29, and interlayer dielectric film 30 and wiring trenches are formed on the stopper-insulating film 31 and insulating film 32, similarly to the case of the third wiring layer, and moreover, a fourth wiring layer 33 is formed similarly to the case of the lower-layer wiring 28 of the third wiring layer. The wiring 33 is formed integrally with a connecting member connecting with the lower-layer wiring 28 by the dual damascene method, as described above. However, it is also possible to form the wiring 33 by the single damascene method, in which a connecting member and a wiring are separately formed similarly to the case of the third wiring layer.

Because methods of forming the insulating films 29 to 32, a connective hole, a wiring trench, and the wiring 33 are respectively the same as in the case of a corresponding member of the third wiring layer, their descriptions are omitted. However, because they are formed on layers higher than the third wiring layer, their design rules can be moderated, and, as shown by the sectional view in FIG. 10, their dimensions including the wiring width are larger than those of the third wiring layer. However, this embodiment is not restricted to the fact that the above dimensions are increased. It is needless to say that they can be formed at the same dimension (design rule) as the wiring 28 of the third wiring layer.

Figure 10:
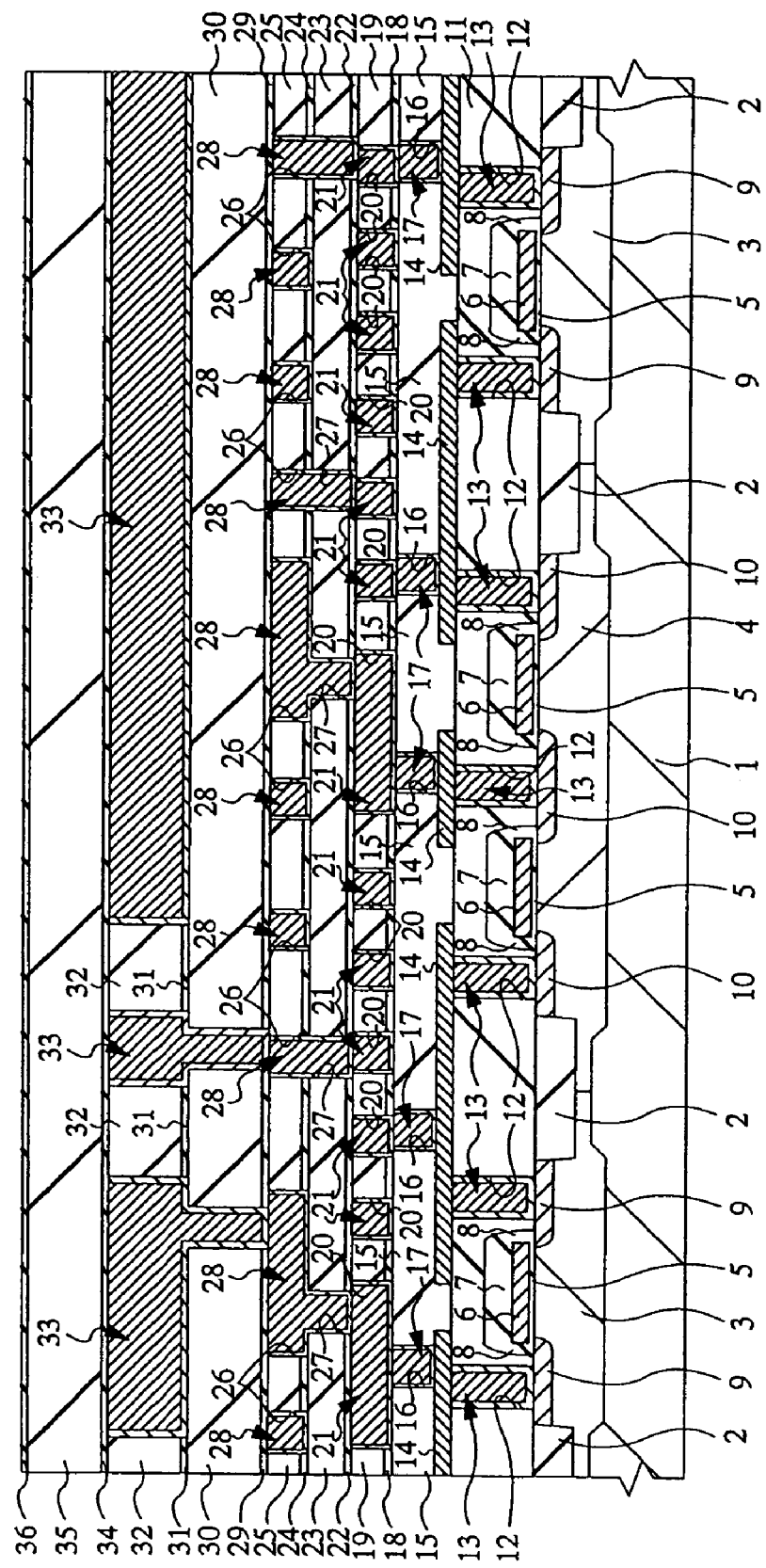

Then, as shown in FIG. 10, insulating films 34, 35, and 36 are formed in order on the wiring 33 and the insulating film 32 of the fourth wiring layer.

The insulating film 34 is constituted by a material having an etching selection ratio to the insulating film 35, such as a silicon-nitride film. The insulating film 34 functions as an etching stopper when etching the insulating film 35, as described later. It is necessary for the insulating film 34 to have a thickness that is large enough to function as an etching stopper, but it is preferable for the film 34 to have a small thickness in order to reduce the capacity between wirings. For example, 50 nm is recommended as the thickness of the insulating film 34.

The insulating film 35 functions as a interlayer dielectric film for insulating the fourth wiring layer from the fifth wiring layer. Therefore, the insulating film 35 is made of a material having a small permittivity, and, for example, a silicon-oxide film can be used as the film 35. Moreover, it is possible to use a silicon-oxide film containing fluorine or an SOG (Spin On Glass) film as the film 35. As described later, a connecting member for connecting the wiring 33 on the fourth wiring layer with a wiring on the fifth wiring layer and a conductive member serving as an electrode constituting a capacitor C are formed on the insulating film 35. The insulating film 35 has a thickness of, for example, 400 nm.

The insulating film 36 is made of a material having an etching selection ratio to an insulating film (silicon-oxide film) formed on a layer higher than the film 36 and the insulating film 35. For example, a silicon-nitride film can be used as the film 36. It is sufficient for the insulating film 36 to have a thickness capable of realizing an etching stopper when etching an upper-layer insulating film (silicon-oxide film). Moreover, to reduce the inter-wiring capacitances of the insulating film 36 and the fifth wiring layer formed on the layer higher than the film 36, it is preferable for the insulating film 36 to have a small thickness. For example, 50 nm is recommended as the thickness of the insulating film 36.

Figure 11:
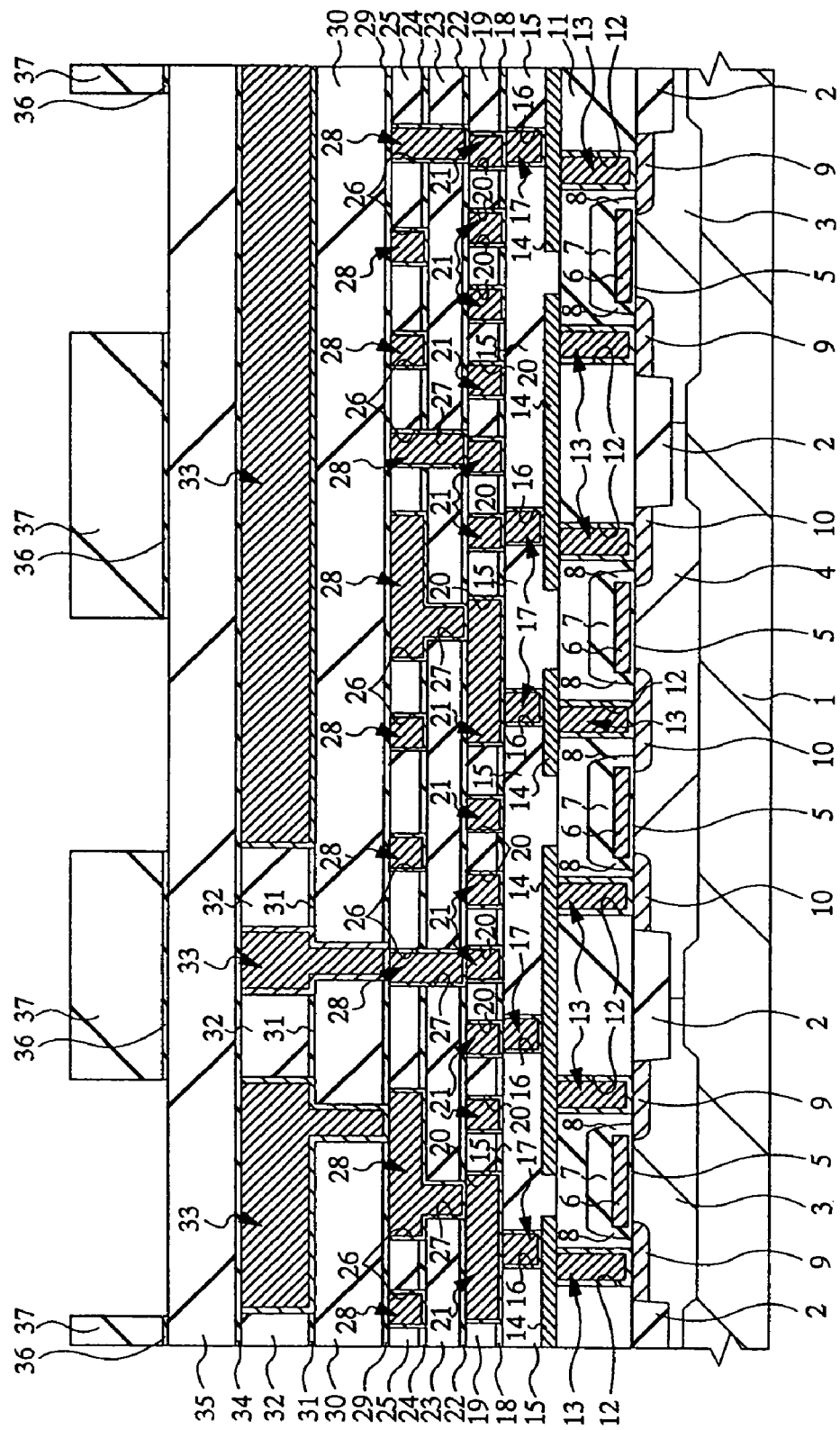

Then, as shown in FIG. 11, a photoresist film 37 having an opening in an area in which a connecting member or conductive member will be formed is formed on the insulating film 36 in order to etch the film 36 by using the photoresist film 37 as a mask. This etching condition is for etching the particular insulating film 36 (such as silicon-oxide film) and also for etching a silicon-oxide films in general. However, because the insulating film 36 has a thickness much smaller than that of the insulating film 35, it would be unlikely for the insulating film 35 to be excessively etched. As described later, the patterned insulating film 36 is used as an etching mask for forming a connective hole or conducive-member-forming hole on the insulating film 35. A mask used for the above photolithography can use a mask obtained by combining a connective-member-forming mask with a conductive-member(capacitor C)-forming mask.

Figure 12:
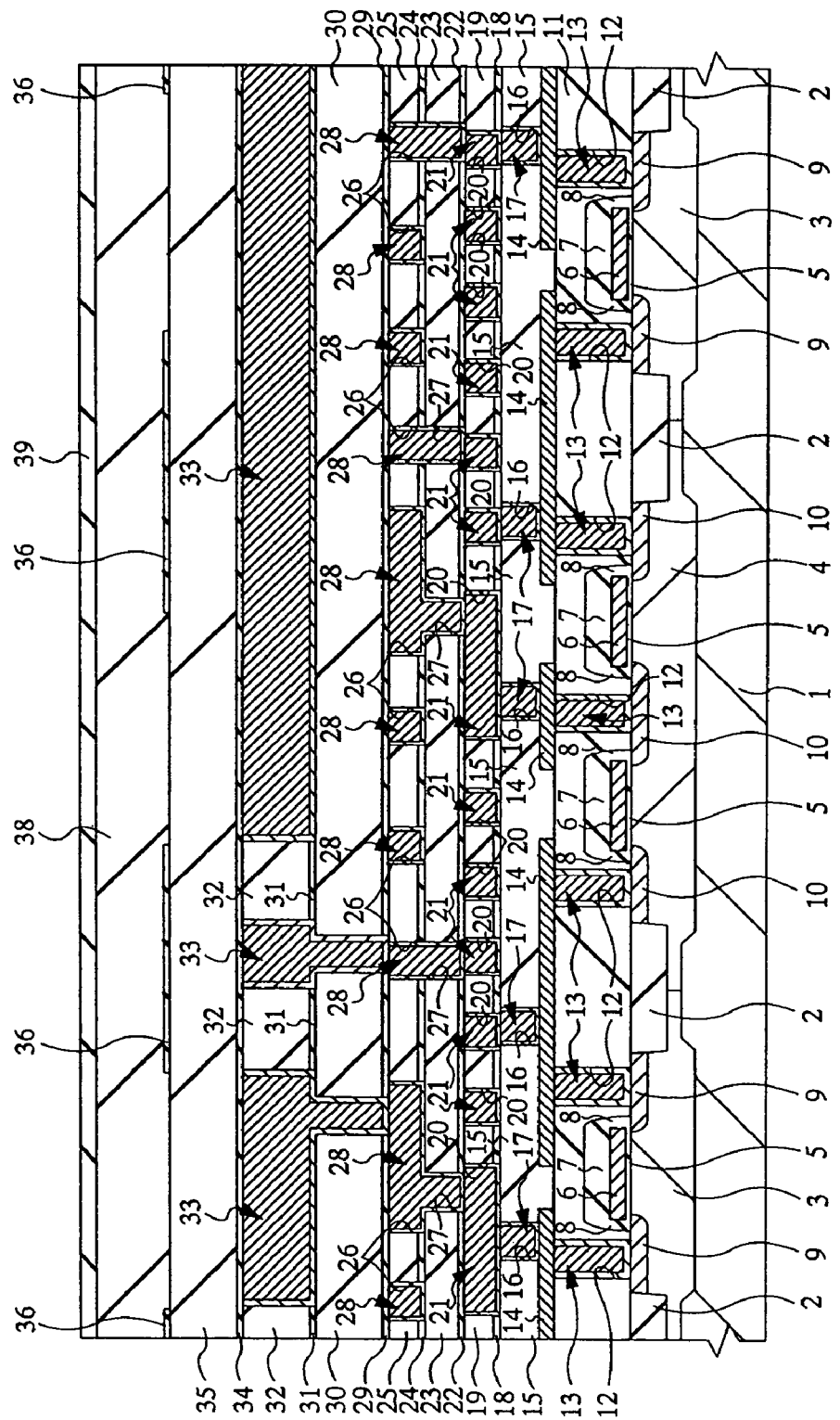

Then, as shown in FIG. 12, insulating films 38 and 39 are formed on the patterned insulating film 36.

The insulating film 38 is an insulating film for forming wirings on the fifth wiring layer by the damascene method and is made, for example, of a silicon-oxide film. Because the insulating film 38 also performs the function of insulating wirings of the fifth wiring layer from each other, it is preferable to form the film 38 by using a material having a low permittivity. A silicon-oxide film meets the above condition. Moreover, it is possible to form the insulating film 38 by using a silicon-oxide film or an SOG film having a lower permittivity. The thickness of the insulating film 38 is decided by the thickness requested for the design of wirings of the fifth wiring layer. When assuming the fifth wiring layer M5 to be the uppermost layer, 1,000 nm can be used as the thickness of the film 38.

The insulating film 39 is used as a hard mask which is used to form wiring trenches for forming wirings on the fifth wiring layer. It is preferable that the insulating film 39 has an etching selection ratio to the insulating film 38, and it is possible to use a silicon-oxide film (hereafter referred to as TEOS-oxide film) formed through plasma CVD by using TEOS (tetraethoxysilane) gas.

Figure 13:
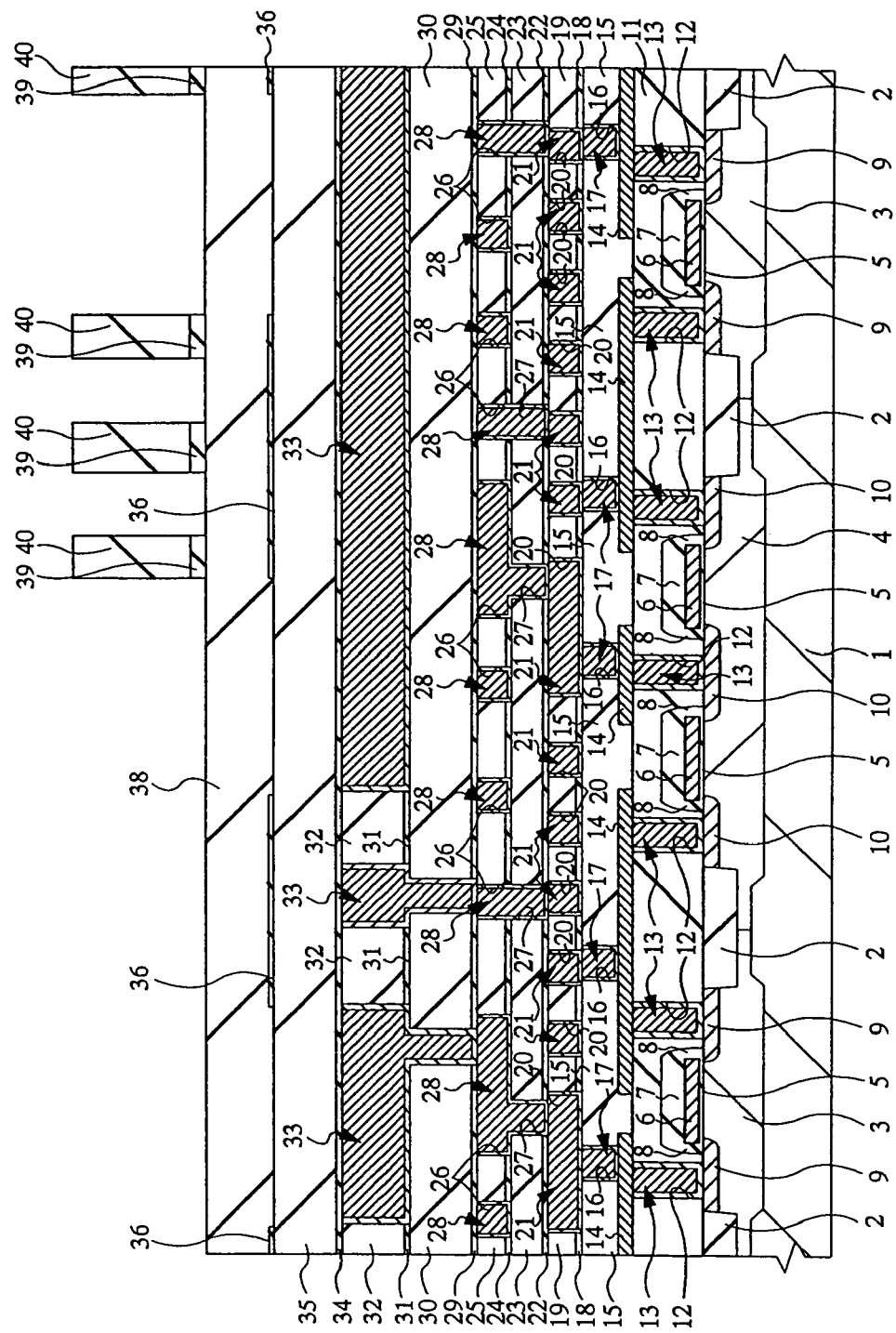

Then, as shown in FIG. 13, a photoresist film 40 is formed. The photoresist film 40 has an opening in an area in which wirings of the fifth wiring layer will be formed. The insulating film 39 is etched by using the photoresist film 40 as a mask to pattern the insulating film 39.

Figure 14:
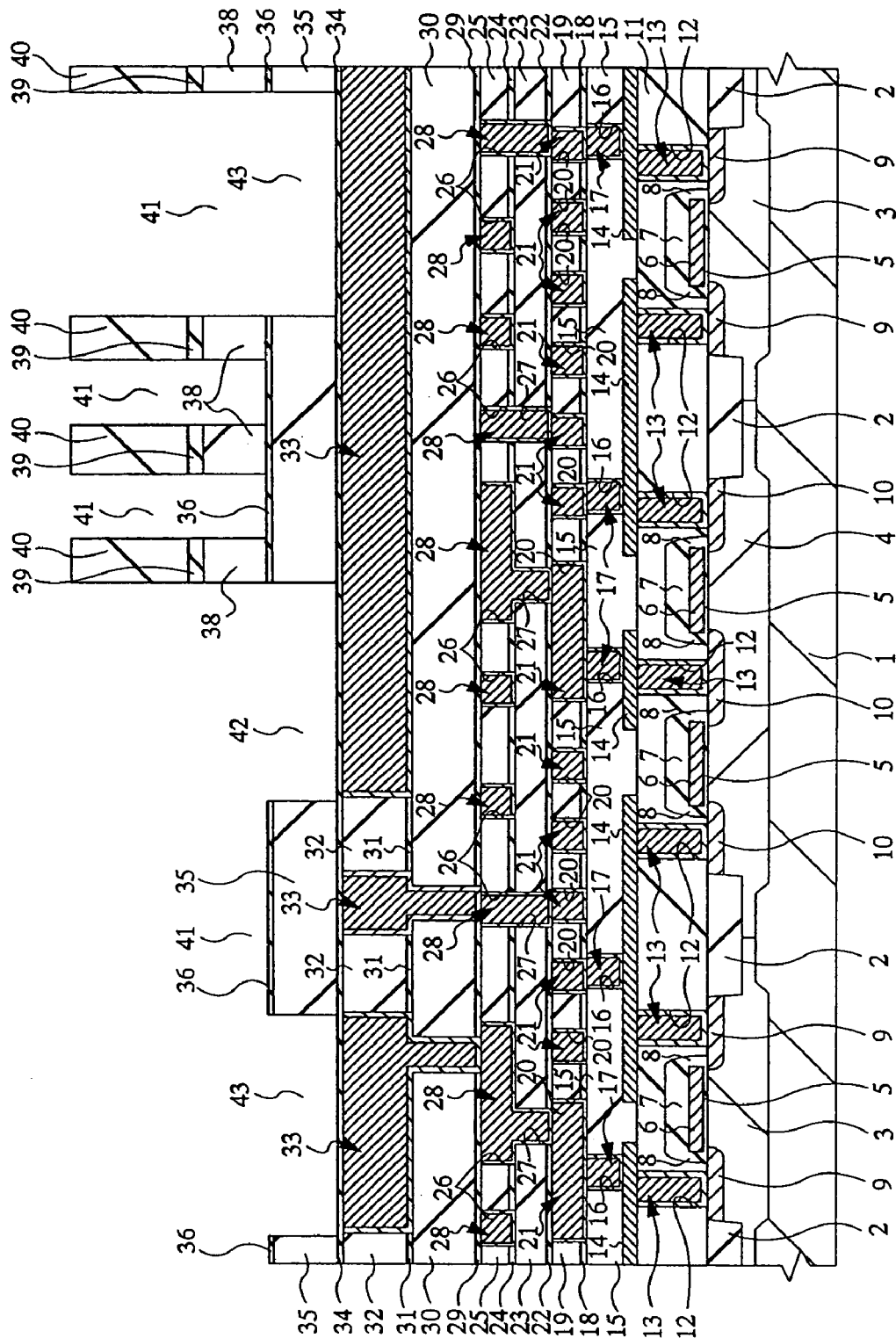

Then, as shown in FIG. 14, the insulating film 38 is etched by using the photoresist film 40 or insulating film 39 as a mask. Thereby, a wiring trench 41 is formed. By continuing the etching, the insulating film 35 is etched by using the pattered insulating film 36. Thereby, a part of the connective hole 42 and a conductive-member-forming hole 43 are formed. For the above etching, a condition is selected in which a silicon-oxide film is easily etched but a silicon-nitride film is not easily etched. By selecting the above condition, the insulating film 36 formed by a silicon-nitride film functions as an etching stopper for forming the wiring trench 41, and also functions as a mask for forming the connective hole 42 and the hole 43.

Figure 15:
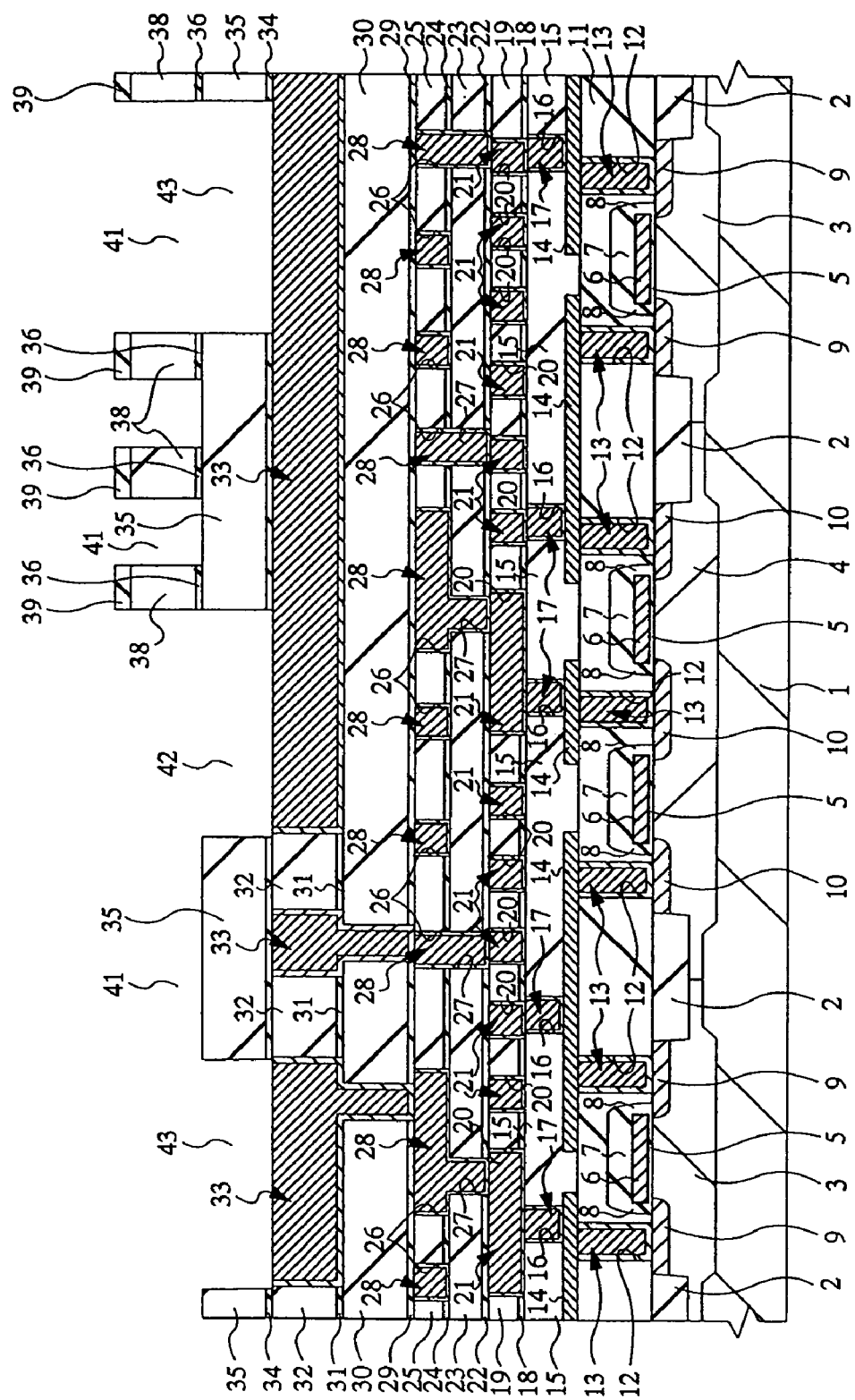

Then, the photoresist film 40 is removed to etch away the exposed insulating film 36, as shown in FIG. 15. For the above etching, a condition for etching a silicon-nitride film is selected. Thus, by excessively etching the silicon-nitride film (insulating film 36), it is possible to reduce the capacity between wirings and improve the response speed of a semiconductor integrated circuit device.

Figure 16:
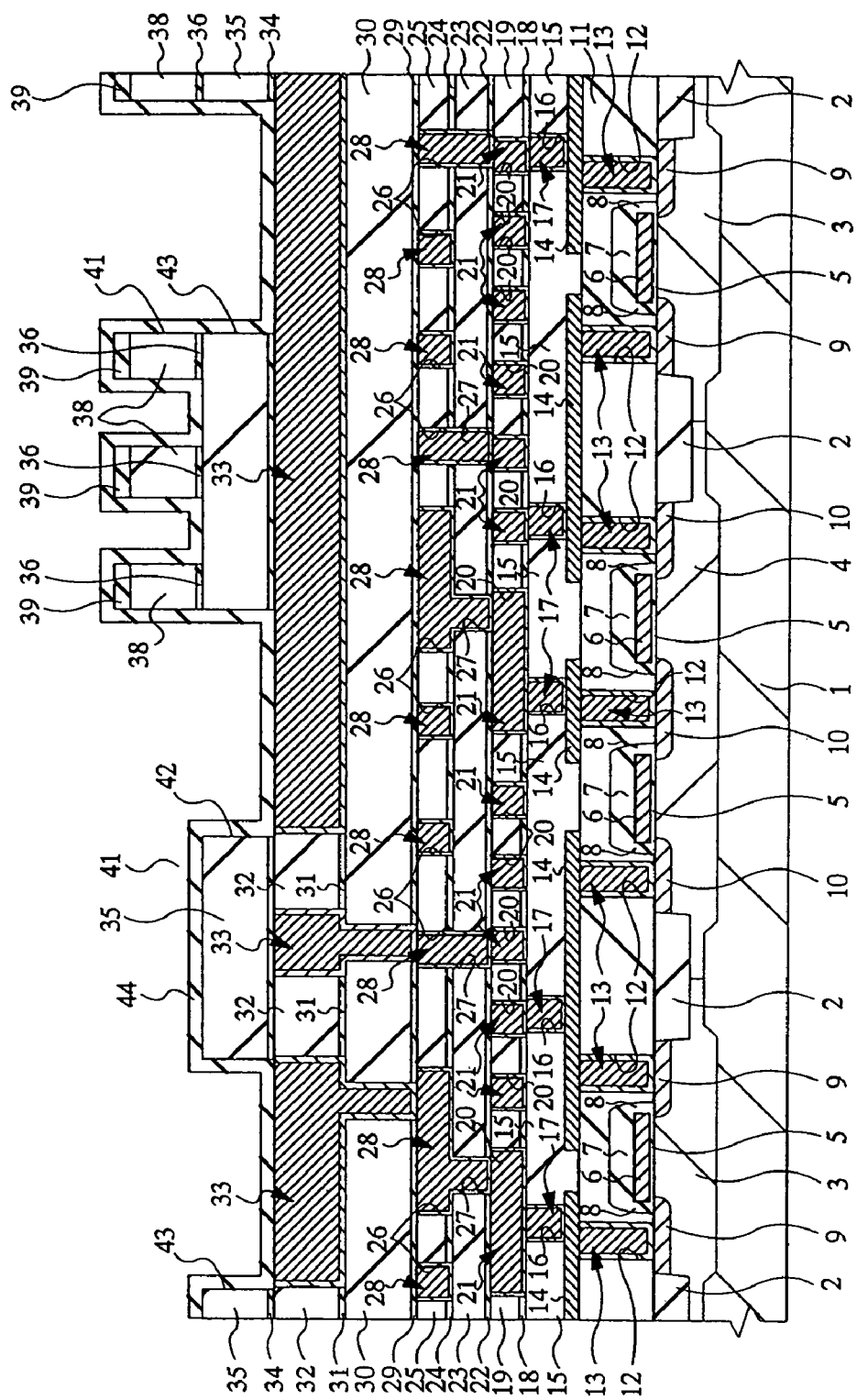

Then, as shown in FIG. 16, a tantalum-oxide film 44 is formed above the entire surface of the semiconductor substrate 1. The tantalum-oxide film 44 functions as a capacitor-insulating film of the capacitor C. The tantalum-oxide film 44 has a high permittivity of 20 or higher as compared to a silicon-oxide film and the like, and, thereby, it is possible to obtain a large capacitor capacitance from even a small dedicated area. In this case, though tantalum oxide is used, it is also possible to use a material having a higher permittivity, such as BST or PZT. It is preferable for the tantalum-oxide film 44 to have a thickness that causes no leakage current and is as thin as possible. For example, 50 nm can be used as the thickness of the film 44, and CVD can be used to form the tantalum-oxide film 44. Because the film 44 is formed through CVD, it is possible to form a film that is superior in step coverage. Moreover, a film formed through CVD is generally amorphous when it is in an as-deposition state. Therefore, it is possible to perform the heat treatment for crystallizing the tantalum-oxide film 44. The relative permittivity of the crystallized tantalum-oxide film rises further to approx. 40, and, thereby, the capacitor capacitance can be further increased. Moreover, an oxygen defect may be present in tantalum oxide under the as-deposition state or crystallized state, and the oxygen defect may cause a leak current. Therefore, it is possible to perform the heat treatment for removing the oxygen defect from the tantalum-oxide film 44 in an oxidizing atmosphere. Because the thickness of the tantalum-oxide film 44 that is free from the oxygen defect can be decreased, it is possible to secure a large capacitor capacitance.

Figure 17:
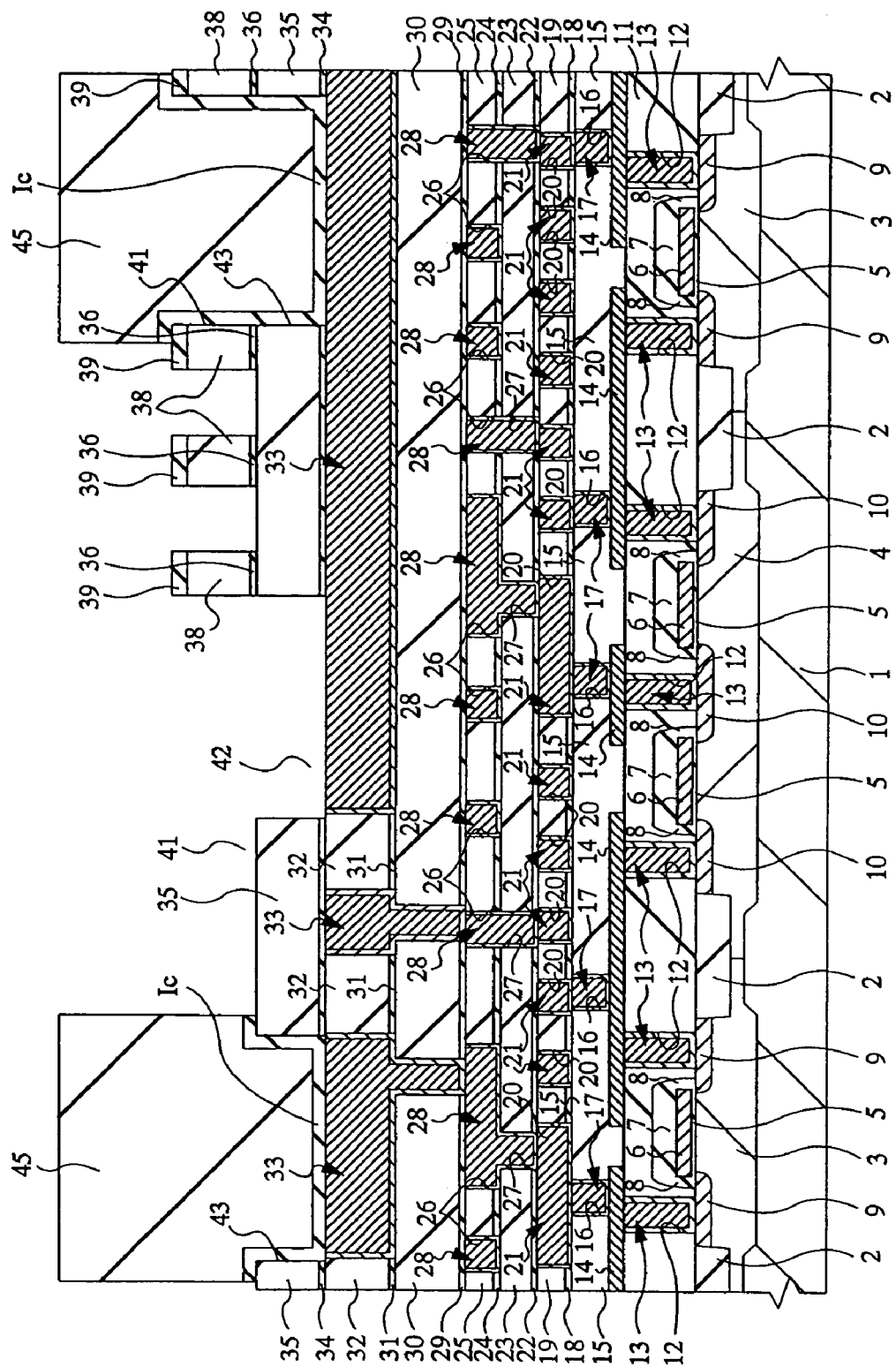

Then, as shown in FIG. 17, a photoresist film 45 is formed on the tantalum-oxide film 44. The photoresist film 45 is formed so as to cover an area in which capacitors C will be formed. In this case, the conductive-member-forming mask used for FIG. 11 can be used as a photolithography mask. Because the film 45 is formed in a pattern opposite to that in the process in FIG. 11, the positive type and negative type of photoresist to be used are reversed compared to the case of the above process. Moreover, in this process, the pattern of the photoresist film 45 is formed so as to be slightly wider than a mask pattern. Thus, by enlarging the pattern of the photoresist film 45, it is possible to compensate a shift for mask alignment and securely form a capacitor-insulating film. The above enlargement of the photoresist pattern can be performed by adjusting the exposure condition.

Then, the tantalum-oxide film 44 is etched by using the photoresist film 45 as a mask to form a capacitor-insulating film 1c.

Figure 18:
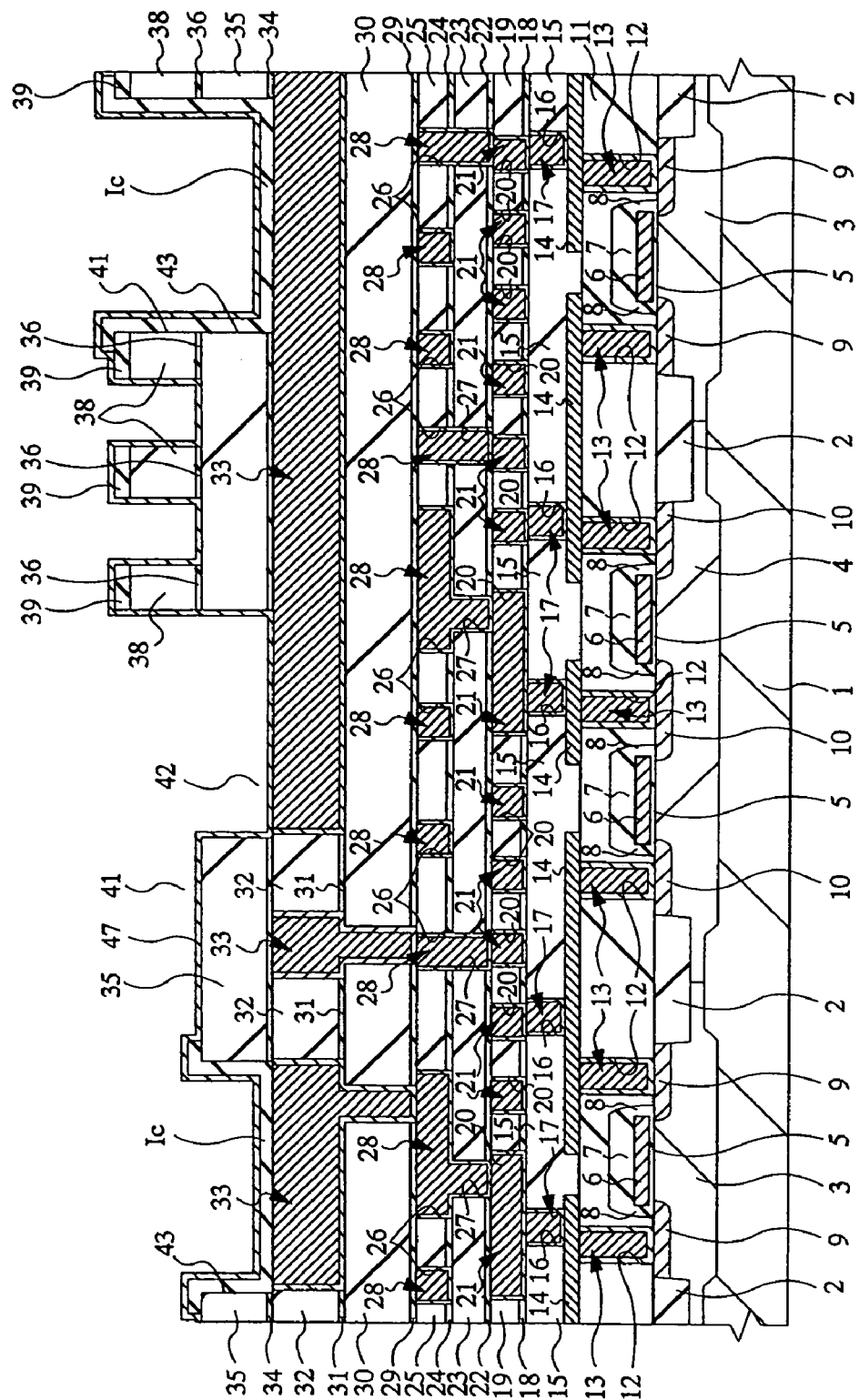

Next, as shown in FIG. 18, the photoresist film 45 is removed to form a titanium-nitride film 47 above the entire surface of the semiconductor substrate 1. The titanium-nitride film 47 functions as a copper diffusion barrier film and serves as the barrier layer Mb previously described. It is possible to form the film 47 not only by titanium nitride but also tantalum or tantalum nitride, as long as the substance has a function for preventing copper from diffusing. The titanium-nitride film 47 is formed through a process such as CVD. CVD makes it possible to form a film superior in step coverage and a blocking film superior in prevention of copper diffusion without forming a void and the like at a bottom corner of the connective hole 42 or hole 43.

Figure 19:
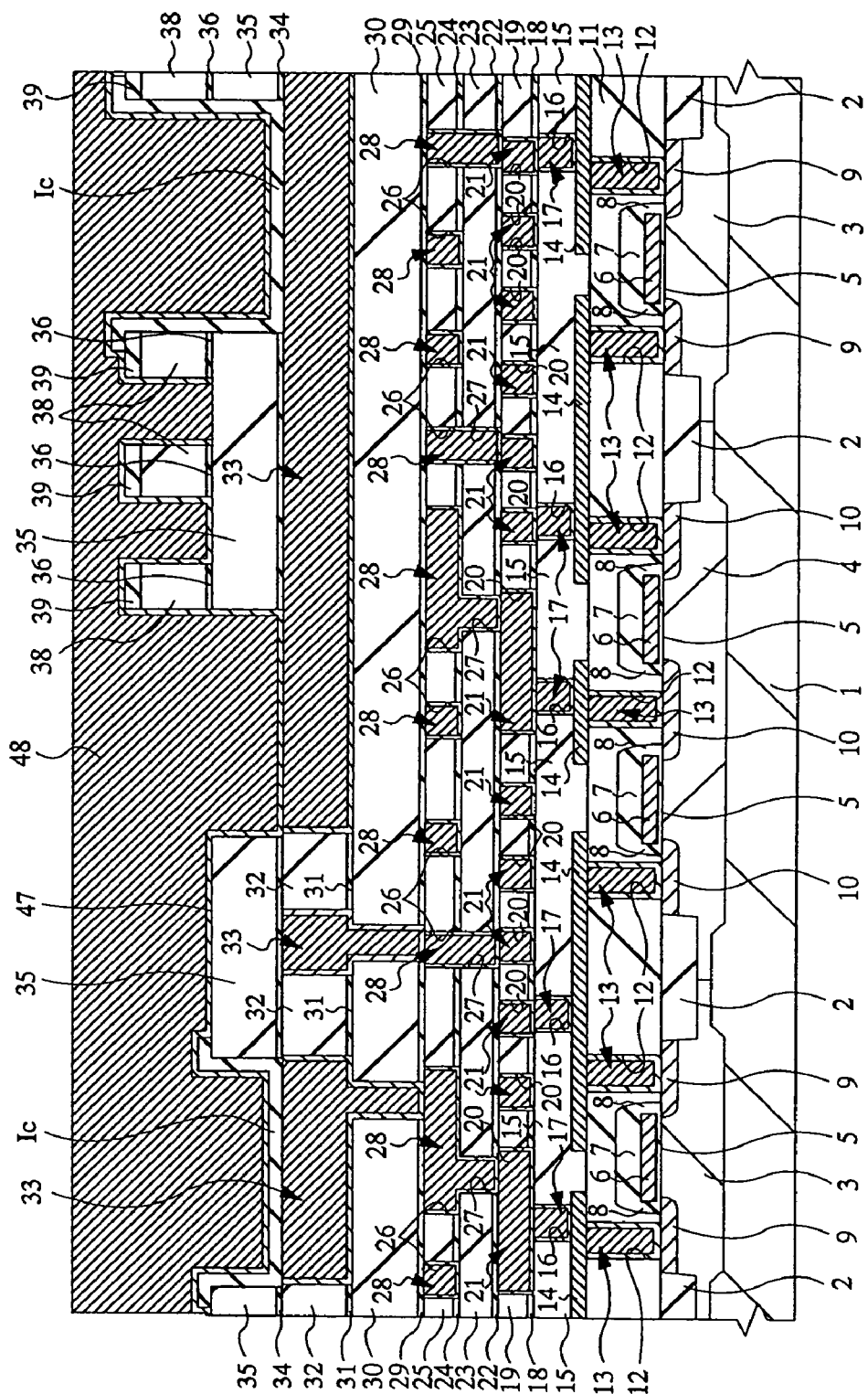

Then, as shown in FIG. 19, a copper film 48 is formed above the entire surface of the semiconductor substrate 1. The copper film 48 serves as the main conductive layer Mm, as previously described. By using copper, it is possible to reduce wiring resistance and improve the response speed and performance of a semiconductor integrated circuit device.

Next, the copper film 48 and titanium-nitride film 47 are polished through CMP to remove the copper film 48 and titanium-nitride film 47 from the surface of the insulating film 39. Thereby, the semiconductor integrated circuit device shown in FIG. 3 is almost completed. Moreover, the semiconductor integrated circuit device is completed by passing through the steps of forming a passivation film and a bonding pad and a packaging step. However, subsequent steps are omitted.

According to the semiconductor integrated circuit device of this embodiment, because a capacitor C is formed between the power-source wiring of the fifth wiring layer and that of the fourth wiring layer, it is possible to smooth the fluctuation of power-source voltages, suppress generation of AC noises, and improve the operational reliability of the semiconductor integrated circuit device. Moreover, because a capacitor C is formed between wiring layers, the dedicated area of a semiconductor substrate for forming a capacitor is not increased, and the semiconductor integrated circuit device can be easily integrated. Furthermore, because capacitors C are uniformly distributed over almost the entire surface of the semiconductor substrate 1, even if power consumption is locally increased at a specific portion, it is possible to effectively reduce AC noises because any capacitor C near the specific portion works effectively.

Figure 20:
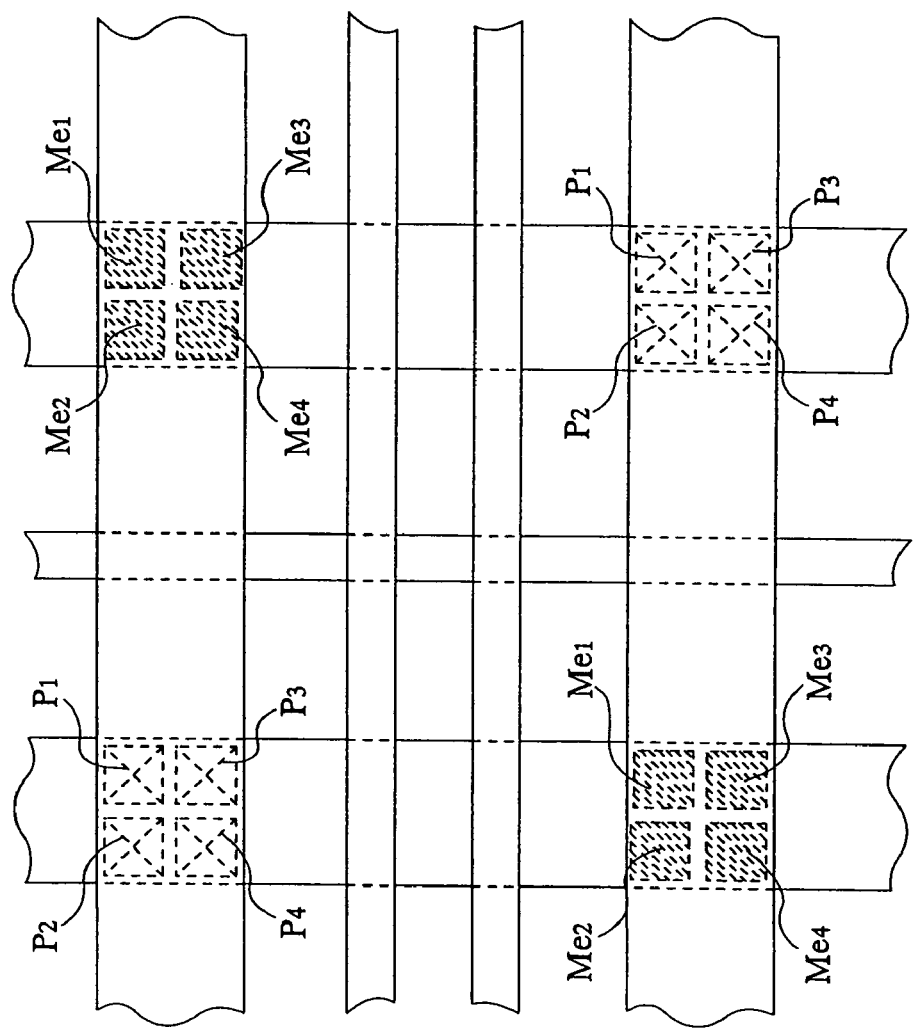
FIG. 20 is a plan view showing another semiconductor integrated circuit device of an embodiment of the present invention.

In this embodiment, a case is described in which the connecting member P and conductive member Me between the fifth wiring layer and fourth wiring layer are formed in a single hole. However, as shown in FIG. 20, it is possible to form the connecting member P and conductive member Me by respectively dividing the members P and Me into four connecting members $P_1$ to $P_4$ and four conductive members $Me_1$ to $Me_4$. Thus, when forming a connecting member or a conductive member by forming a plurality of hole patterns, it is possible to form holes in accordance with the design rule that is the same as the case of a lower-layer hole pattern. Therefore, such advantages are obtained that it is possible to use a photolithography condition and the like in common, shorten the process development period, and improve the process stability. Moreover, because many holes are formed, a connective resistance is not increased and/or the capacitance of a capacitor C is not decreased. It is needless to say that the number of divisions of a member is not restricted to 4, and a lower number of divisions (e.g. two divisions) or a higher number of divisions (e.g. nine divisions) is allowed.

Moreover, in this embodiment, a case is described in which the tantalum-oxide film 44 is formed as a single layer. However, it is also possible to form the tantalum-oxide layer 44 as a multilayer film of two layers or more. In this case, it is possible to reduce the leak current of the tantalum-oxide film 44. That is, when the tantalum-oxide film 44 is formed of a polycrystal film, it is estimated that most of the leak paths of the film are present on a grain boundary. In this case, when the tantalum-oxide film 44 is formed as a single layer, a leak path is formed by penetrating in the film-thickness direction. However, when the tantalum-oxide film 44 is formed by two layers, a grain boundary becomes discontinues at an interface, and the leak path is cut off. Thereby, an advantage is obtained that the leakage current can be reduced.

Embodiment 2

Figure 21:
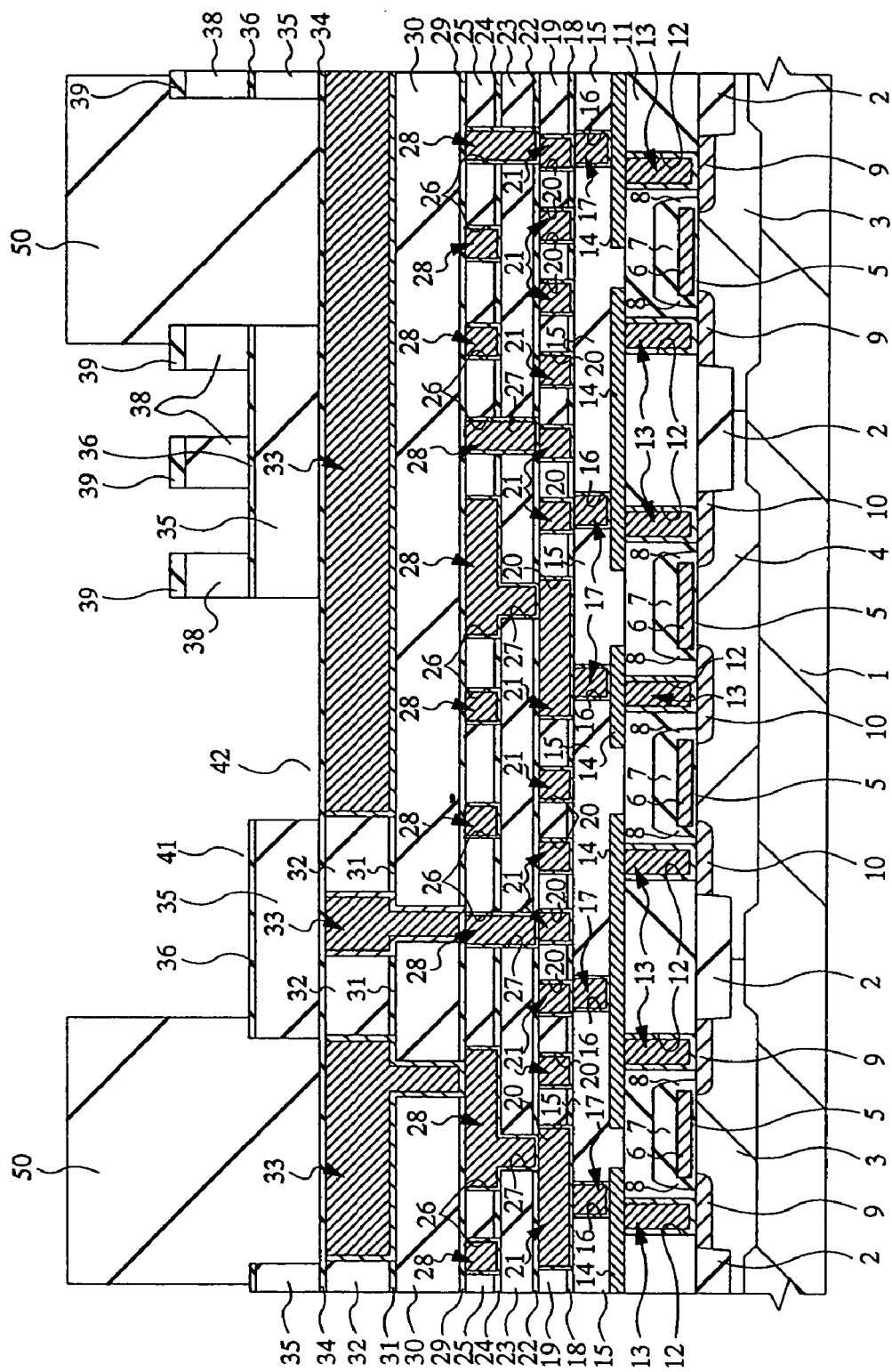
FIGS. 21 to 23 are sectional views showing a method of manufacturing a semiconductor integrated circuit device of the second embodiment in order of step.
Figure 22:
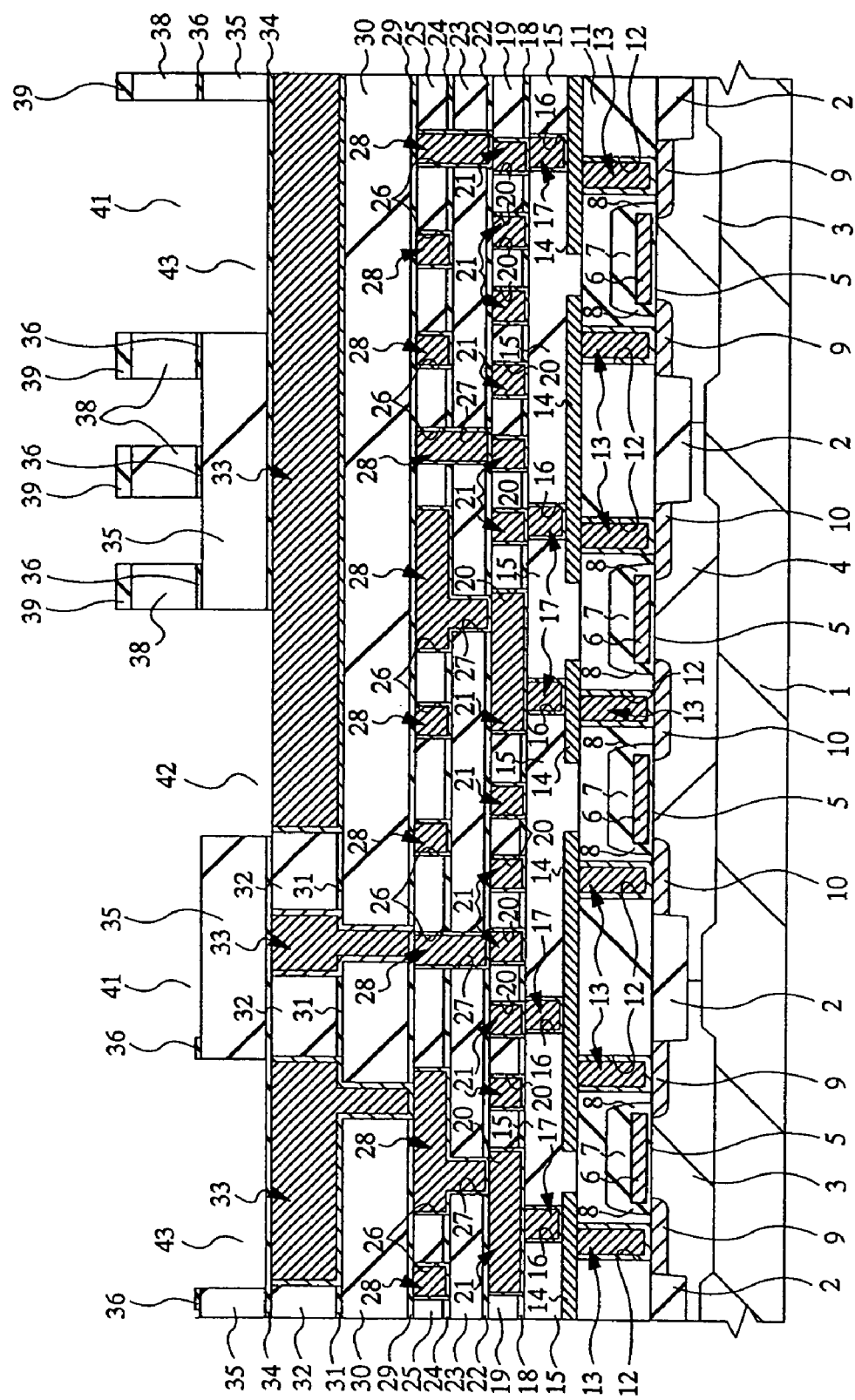
Figure 23:
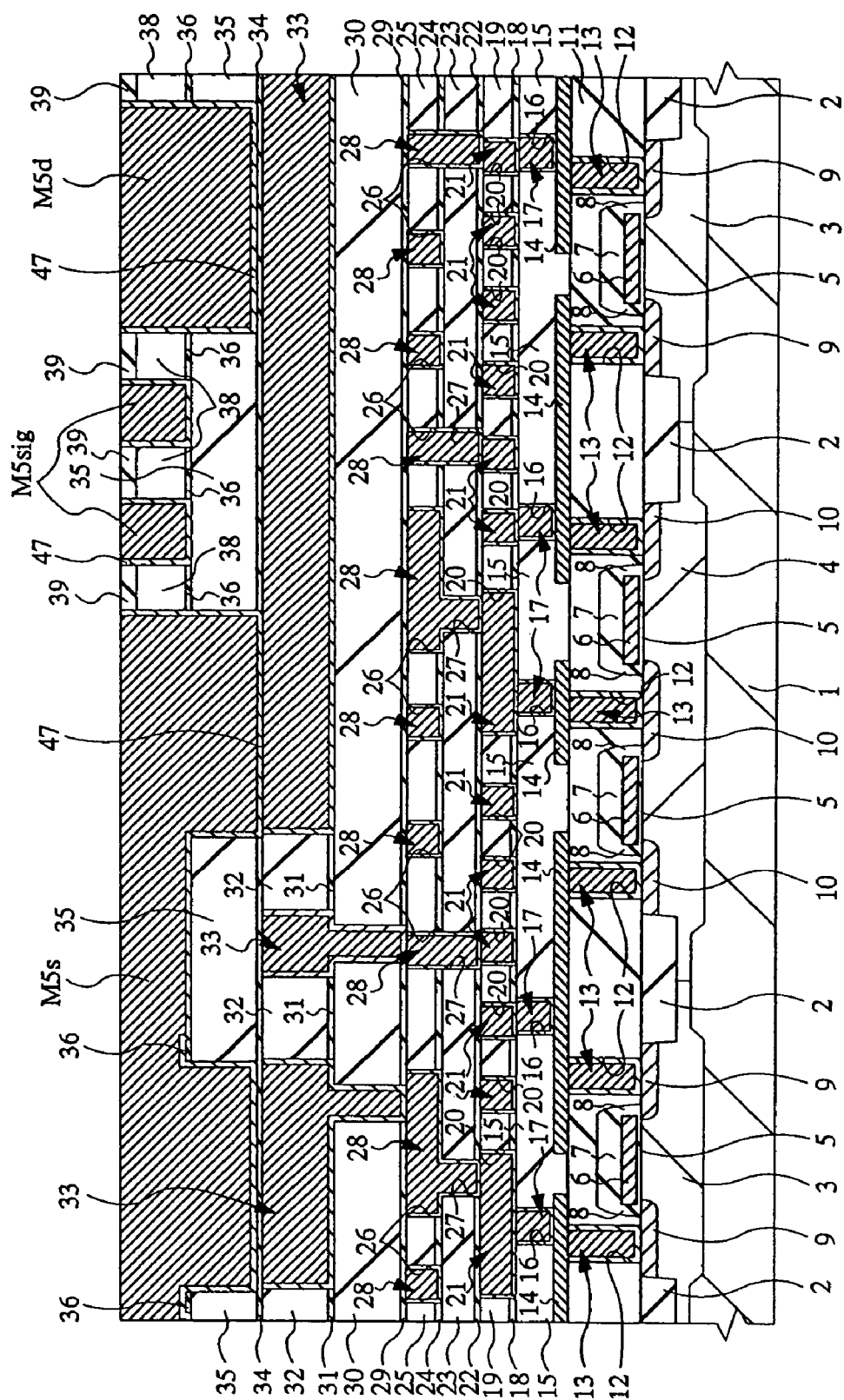

FIGS. 21 to 23 are sectional views of a semiconductor integrated-circuit-device manufacturing method of another embodiment of the present invention in step order. The manufacturing method of this embodiment is the same as in the steps up to FIG. 14 of the first embodiment.

The photoresist film 40 in FIG. 14 is removed, and then, a photoresist film 50 is formed as shown in FIG. 21. The photoresist film 50 is the same as the photoresist film 45 in FIG. 17 of the first embodiment. That is, the film 50 is formed so as to cover a hole 43 in an area in which a capacitor C will be formed.

A condition for etching a silicon-nitride film is selected under the presence of the photoresist film 50 to etch the film. As shown in FIG. 22, an insulating film 34 serving as a silicon-nitride film is present at the bottom of the hole 43 in the area in which the capacitor C will be formed, and the film 34 functions as a capacitor-insulating film 1*c* of the capacitor C. The insulating film 34 at the bottom of a connective hole 42 is etched and the wiring surface of a fourth wiring layer is exposed. Moreover, an insulating film 36 (silicon-nitride film) at the bottom of a wiring trench 41 is also etched away.

Thereafter, a titanium-nitride film and a copper film are formed similarly to the case of the first embodiment, and then unnecessary titanium-nitride film and copper film are removed through CMP to form wirings m5*s*, M5sig, and m5*d* of a fifth wiring layer.

According to this embodiment, it is possible to use the insulating film 34 for a capacitor-insulating film and therefore, simplify the manufacturing process.

Embodiment 3

Figure 24:
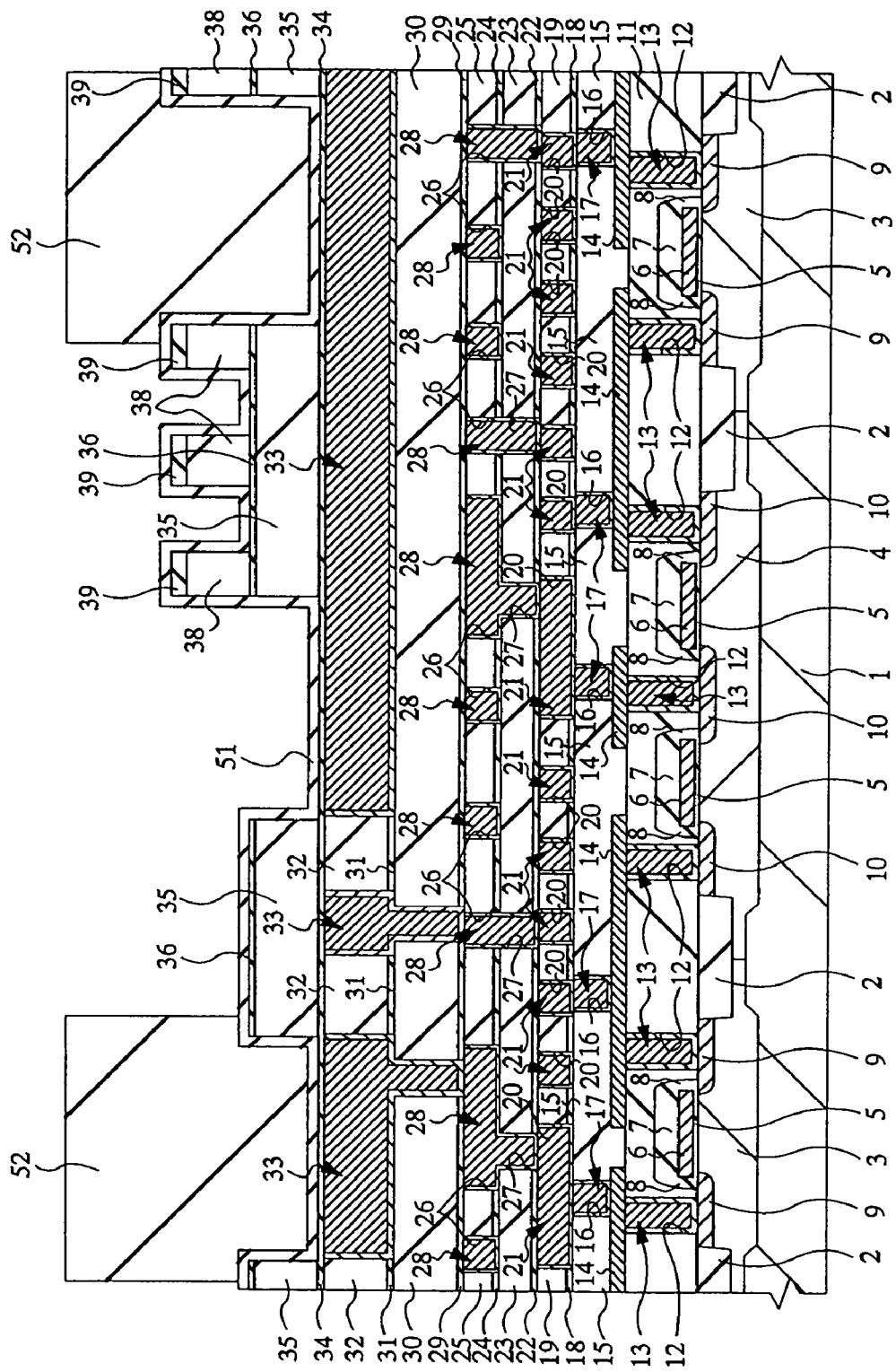
FIGS. 24 and 25 are sectional views showing a method of manufacturing a semiconductor integrated circuit device of the third embodiment in order of step.
Figure 25:
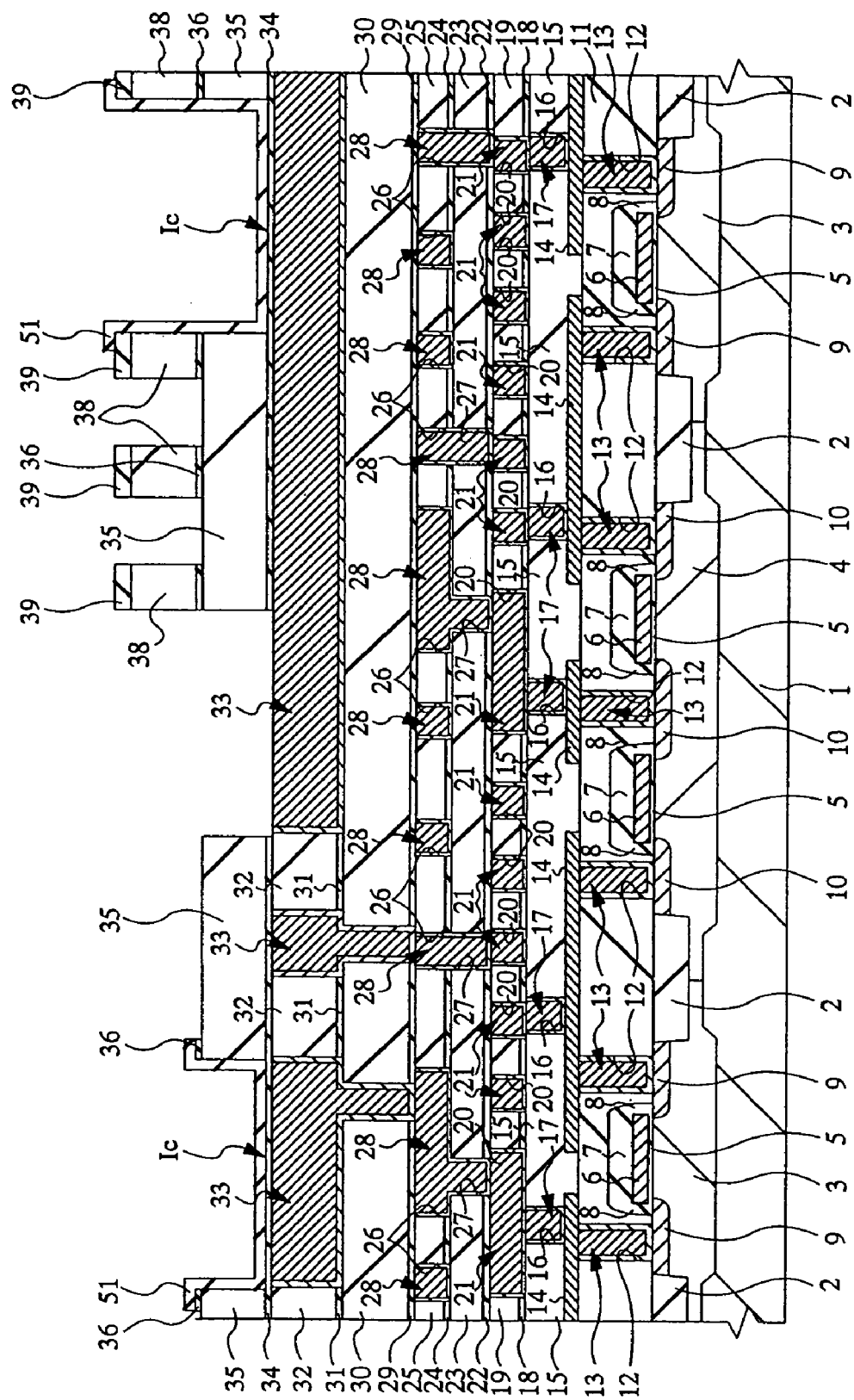

FIGS. 24 and 25 are sectional views of a semiconductor integrated-circuit-device manufacturing method of yet still another embodiment of the present invention in step order. The manufacturing method of this embodiment is the same as in the steps up to FIG. 14 of the first embodiment.

After the photoresist film 40 in FIG. 14 is removed, a tantalum-oxide film 51 is formed as shown in FIG. 24 without etching an insulating film 34. Thus, by leaving the insulating film 34 made of a silicon-nitride film below the tantalum-oxide film 51, it is possible to completely heat-treat (oxidation-reform) the tantalum-oxide film 51 in an oxidizing atmosphere. That is, it is possible to use the insulating film 34 for an oxygen-blocking film when oxidation-reforming the tantalum-oxide film 51. Therefore, it is possible to reduce the leak current of the tantalum-oxide film 51 and form a thin tantalum-oxide film 51. Therefore, it is possible to increase the capacitance of a capacitor C. Moreover, it is possible to improve the permittivity of the tantalum-oxide film 51 and increase the capacitance of the capacitor C. Furthermore, when the insulating film 34 is not present, there is the fear that the metal of a lower wiring layer will be oxidized and the adhesiveness between the metal and the tantalum-oxide film 51 will deteriorate. However, in the case of this embodiment, however, this fear is not an issue because the insulating film 34 serving as an oxygen-blocking film is present.

Then, as shown in FIG. 25, etching is performed under the presence of a photoresist film 52 to remove the tantalum-oxide film 51 and insulating films 34 and 36. Thereby, a capacitor-insulating film 1*c* made of the tantalum-oxide film 51 and insulating film 34 is formed.

According to this embodiment, by using the insulating film 34 as an oxygen-blocking film, it is possible to improve the leak characteristic and permittivity of the tantalum-oxide film 51. Moreover, it is possible to improve the bonding stability of the tantalum-oxide film 51. As a result, it is possible to improve the reliability and stable operations of a semiconductor integrated circuit device.

Embodiment 4

FIGS. 26 to 30 are sectional views of a semiconductor integrated-circuit-device manufacturing method of yet another embodiment of the present invention in step order. The manufacturing method of this embodiment is the same as in the steps up to FIG. 9 of the first embodiment.

Figure 26:
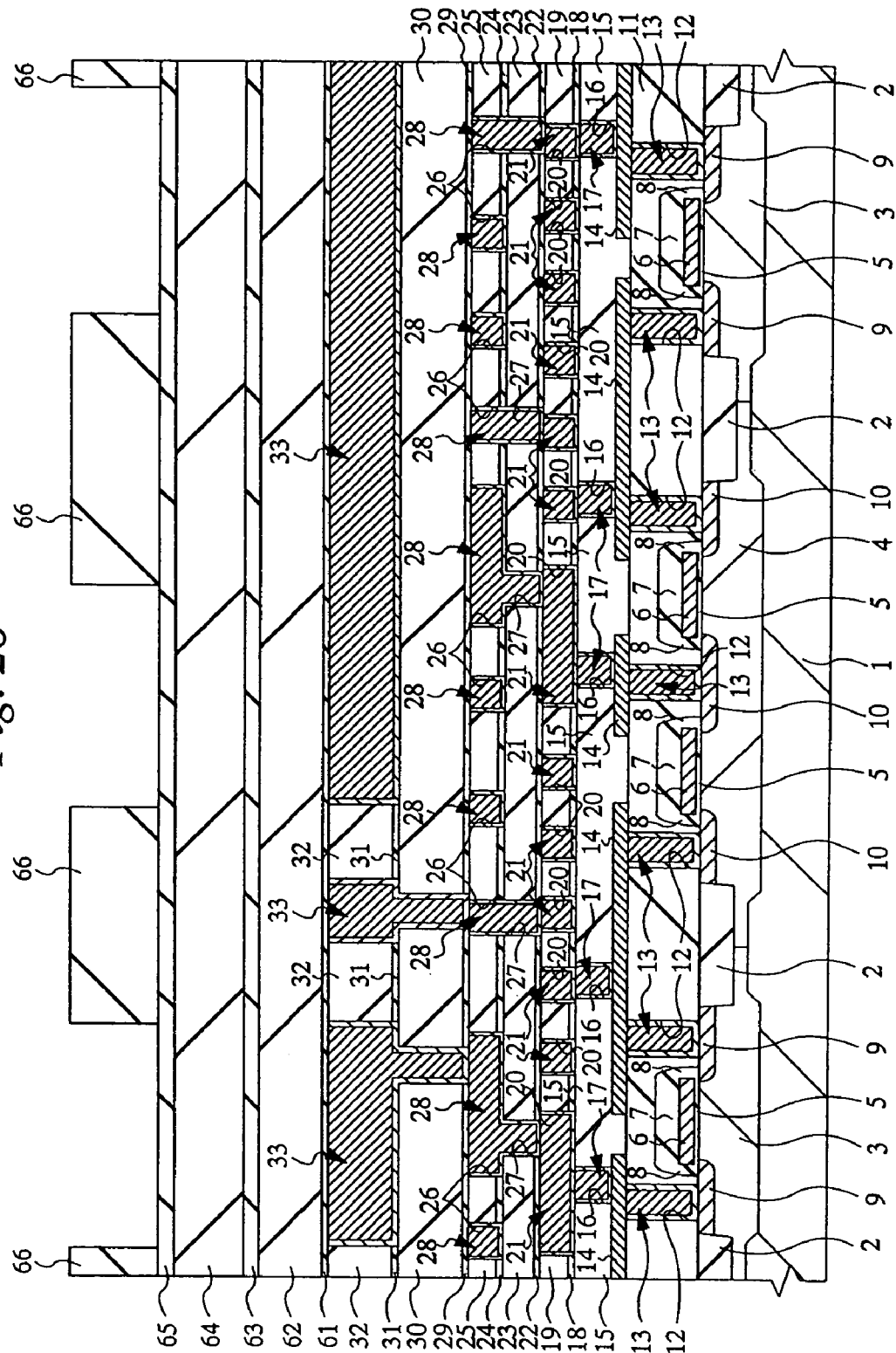
FIGS. 26 to 30 are sectional views showing a method of manufacturing a semiconductor integrated circuit device of the fourth embodiment in order of step.

After the fourth wiring layer shown in FIG. 9 is formed, insulating films 61 to 65 are formed in order as shown in FIG. 26, and a photoresist film 66 is formed which has an opening in an area where a conductive member Me serving as one electrode of a capacitor C on the insulating film 65 is formed and an area where a connecting member P is formed. The photoresist film 66 is the same as the photoresist film 37 the first embodiment.

The insulating film 61 is made of a silicon-nitride film, which is the same as the insulating film 34 in the first embodiment. The insulating film 62 is made of a silicon-oxide film, which is the same as the insulating film 35 of the first embodiment. The insulating film 63 is made of a TEOS-oxide film, for example, and the insulating film 64 is made of, for example, of a silicon-oxide film, which is the same as the insulating film 38 of the first embodiment. The insulating film 65 is the same as the insulating film 39 of the first embodiment.

Figure 27:
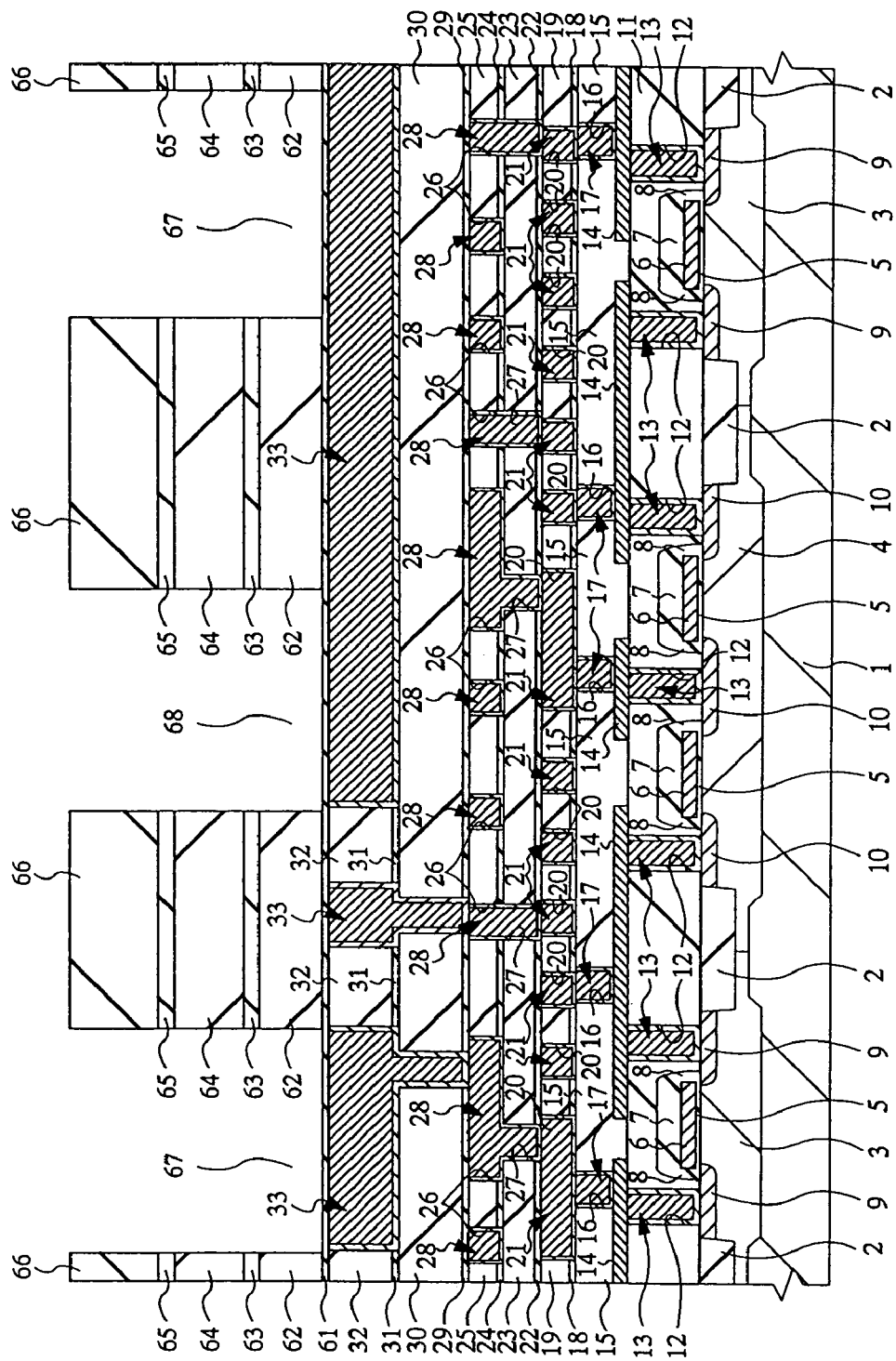

Then, as shown in FIG. 27, the insulating films 65, 64, 63, and 62 are etched by using the photoresist film 66 as a mask. In this case, a silicon-oxide film is etched so that the insulating film 61 functions as an etching stopper, and a condition in which a silicon-nitride film is not easily etched is selected. Thereby, a hole 67 in which a conductive member Me will be formed and a part of a hole 68 in which a connecting member P will be formed are formed.

Figure 28:
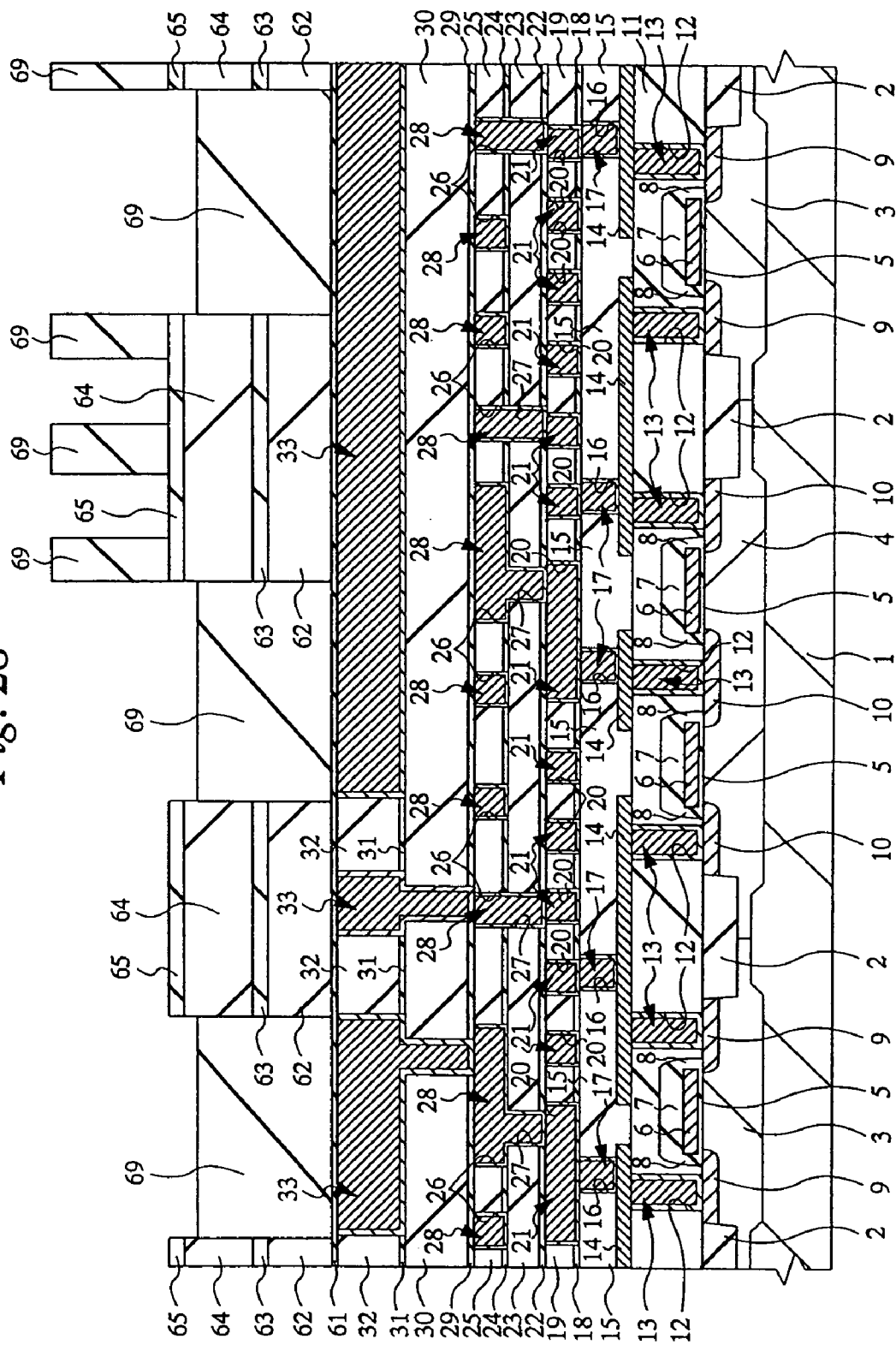

Then, as shown in FIG. 28, the photoresist film 66 is removed, and a new photoresist film is formed and exposed so that an opening is formed in an area in which the wiring of a fifth wiring layer will be formed. Then, the photoresist film is developed so that the exposed portion is removed to form a patterned photoresist film 69. When the above patterning is performed, photoresist films in the hole 67 and the connective hole 68 are not completely exposed, and the photoresist film 69 is left in the holes.

Figure 29:
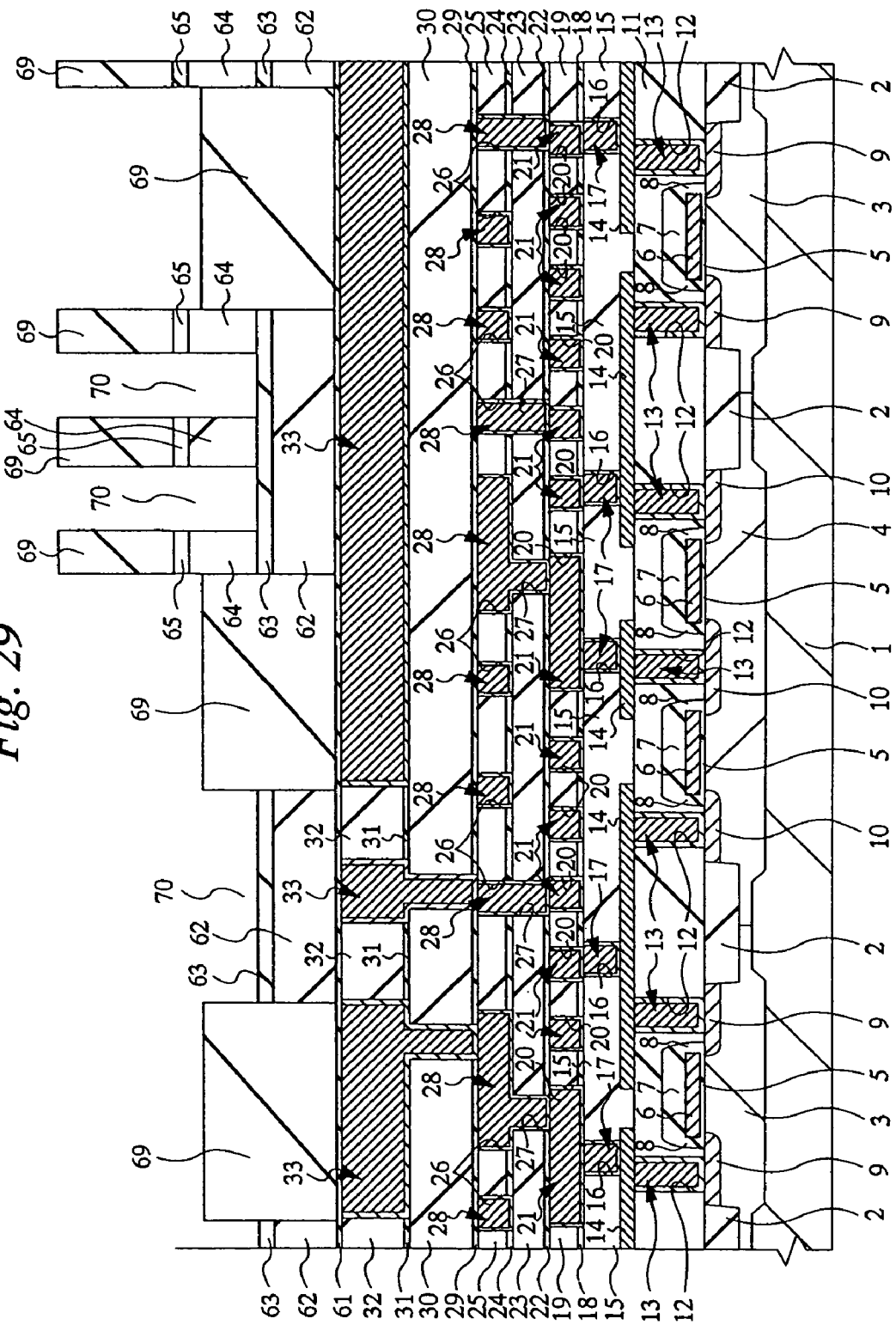

Then, as shown in FIG. 29, the insulating films 65 and 64 are etched under the presence of the photoresist film 69. When the insulating film 64 is etched, the insulating film 63 below the film 64 functions as an etching stopper. Thus, a wiring trench 70 is formed.

Figure 30:
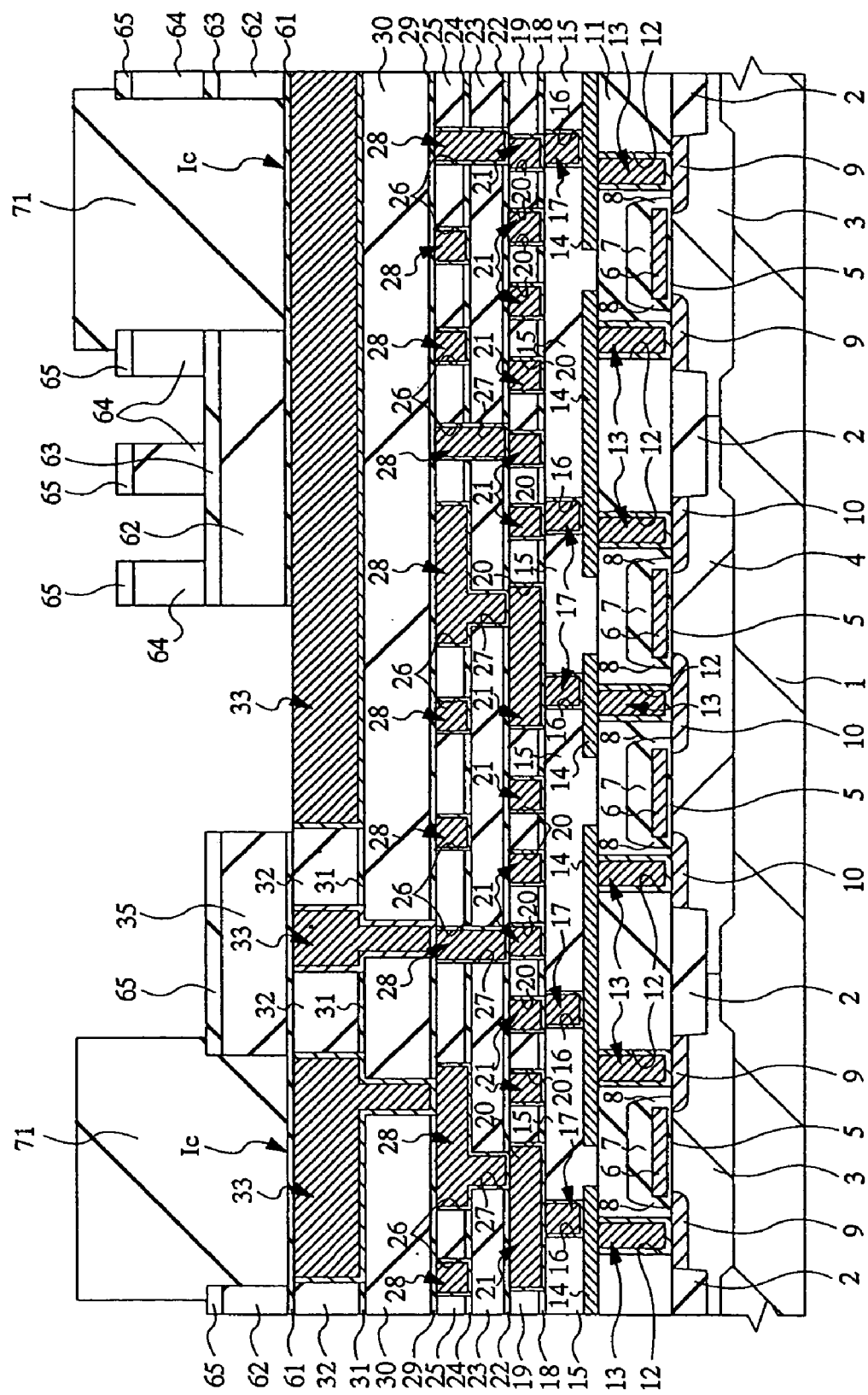

Then, as shown in FIG. 30, the photoresist film 69 is removed to form a photoresist film 71 for covering the hole 67 in which the conductive member Me will be formed as in the case of the photoresist film 45 in the first embodiment. A condition for etching a silicon-nitride film under the presence of the photoresist film 71 is selected to etch the silicon-nitride film. Thereby, the insulating film 61 (silicon-nitride film) at the bottom of the connective hole 68 is removed to expose the wiring surface of a lower wiring layer. Moreover, the insulating film 61 is left at the bottom of the hole 67 in which the conductive member Me will be formed to constitute the capacitor-insulating film 1c of a capacitor C. Subsequent steps are the same as in the case of the first embodiment.

According to the manufacturing method of this embodiment, the connective hole 68 and the hole 67 are formed and then, the wiring trench 70 is formed differently from the case of the first to third embodiments. Therefore, even if a shift is present in the mask alignment between the wiring trench 70, connective hole 68, and hole 67, openings of the connective hole 68 and hole 67 are secured. Therefore, the contact area at the bottom of the connective hole 68 is secured and the contact resistance is not increased. Moreover, the opposite area of the conductive member Me serving as an electrode of the capacitor C is secured, and the capacitor capacitance value is secured.

In the case of this embodiment, as in the third embodiment, it is possible to form a tantalum-oxide film on the entire surface of the semiconductor substrate 1 before forming the photoresist film 71, and then constitute the capacitor-insulating film 1c by the tantalum-oxide film and the insulating film 61.

Embodiment 5

FIGS. 31A to 31(E) and FIGS. 32F to 32H are sectional views showing a semiconductor integrated-circuit-device manufacturing method of yet another embodiment of the present invention in step order. The manufacturing method of this embodiment is the same as in the steps up to the formation of the fourth wiring layer in the first embodiment. In FIGS. 31 and 32, because the structure below the fourth wiring layer is almost the same as those of the above-described embodiments, it is omitted. Moreover, an area in which a capacitor C will be formed is shown to the left of FIGS. 31 and 32, and an area in which a connecting member P will be formed is shown at the right of FIGS. 31 and 32.

Figure 31A:
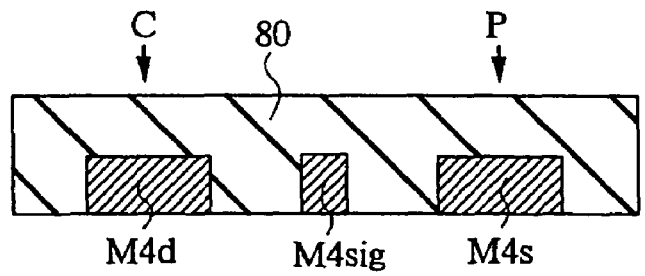
FIGS. 31A to 31(e) and FIGS. 32F to 32G are sectional views showing a method of manufacturing a semiconductor integrated circuit device of the fifth embodiment in order of step.

Wirings m4*d*, M4sig, and m4*s* of a fourth wiring layer are formed, and then, a interlayer dielectric film 80 for covering the fourth wiring layer is formed as shown in FIG. 31A. The interlayer dielectric film 80 is made of a silicon-oxide film, which can be formed through CVD or sputtering.

Figure 31B:
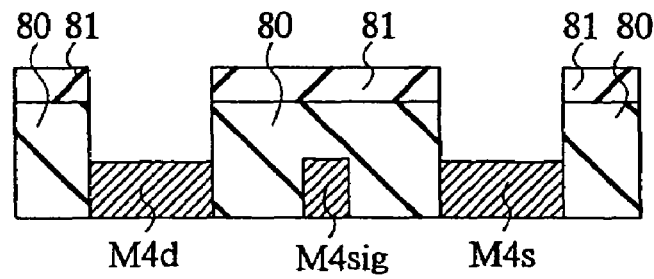
Figure 31C:
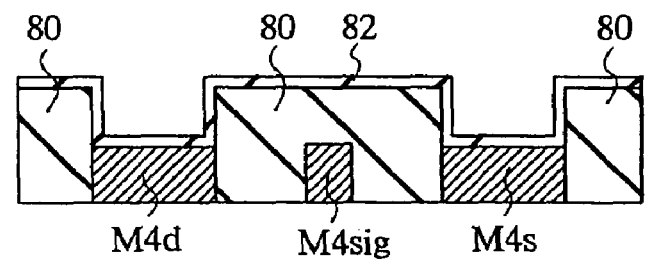
Figure 31D:
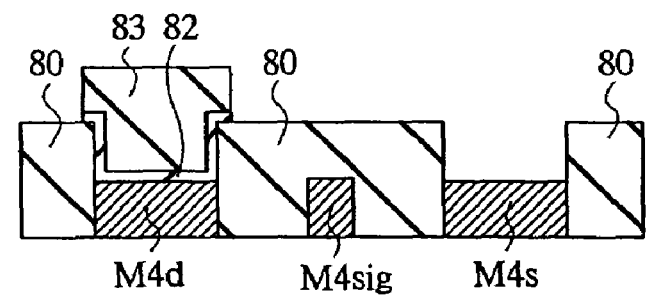
Figure 31E:
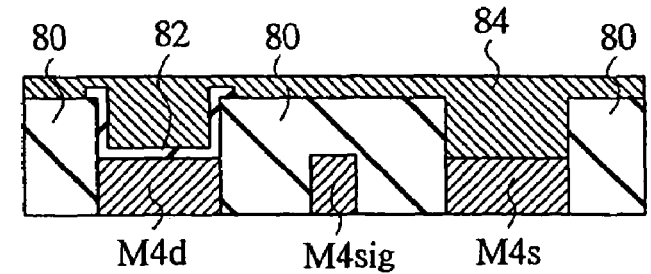

Then, as shown in FIG. 31B, a photoresist film 81 is formed on the interlayer dielectric film 80. The photoresist film 81 is patterned so as to have an opening in an area in which a connective hole will be formed and an area in which a capacitor C will be formed. Then, the interlayer dielectric film 80 is etched by using the photoresist film 81 as a mask to expose the surfaces of the wirings m4*d* and m4*s* of the fourth wiring layer.

Then, after the photoresist film 81 is removed, an insulating film 82 having a high permittivity such as a tantalum-oxide film is formed, as shown in FIG. 31 C. The tantalum-oxide film is formed in the same manner as in the case of the first embodiment.

Then, as shown in FIG. 31 D, a photoresist film 83 is formed so as to cover an area in which a capacitor C will be formed to etch the insulating film 82 by using the photoresist film 83 as a mask. Thereby, the insulating film 82 having a high permittivity remains in the area in which the capacitor C will be formed in order to constitute a capacitor-insulating film and the surface of a lower-layer wiring is exposed in an area in which a connecting member will be formed. The photoresist film 83 is formed in the same manner as in the case of the photoresist film 45 of the first embodiment.

Then, the photoresist film 83 is removed to form a metallic film 84 on the entire surface as shown in FIG. 31(*e*). The metallic film 84 can use a tungsten film formed through CVD and titanium, titanium nitride, or a laminated film of them can be applied to the lower layer of the tungsten film as a barrier metal.

Figure 32F:
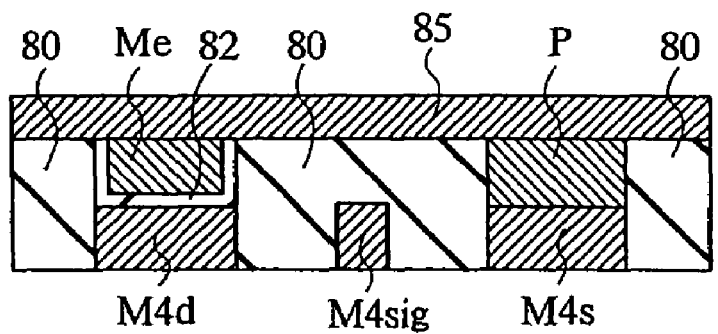
Figure 32G:
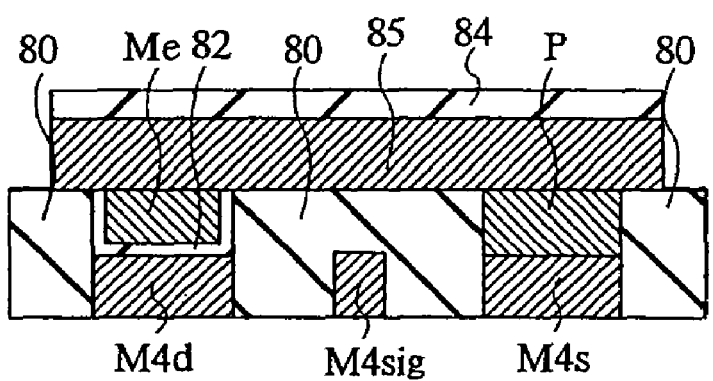

Then, as shown in FIG. 32F, unnecessary metallic film 84 on the interlayer dielectric film 80 is removed through etching-back or CVD to form a conductive member Me serving as electrodes of a plug P and a capacitor C. Moreover, a metallic film 85 is formed on the entire surface. The metallic film 85 serves as the wiring of a fifth wiring layer. For example, an aluminum film can be used. A titanium film, a titanium-nitride film, or a laminated film of titanium and titanium-nitride can be applied to the upper or lower layer of the aluminum film as a cap film or base film.

Figure 32H:
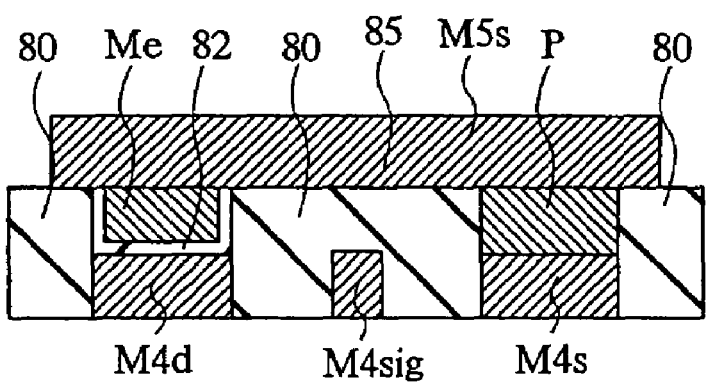

Then, as shown in FIG. 32Q a photoresist film 86 patterned to a wiring pattern is formed to etch the metallic film 85 by using the photoresist film 86 as a mask, as shown in FIG. 32H. Thereby, the wiring m5*s* of the fifth wiring layer is formed.

The fifth wiring layer can also be formed through patterning by a photoresist film without using the damascene method like the case of this embodiment. A capacitor C of the present invention can also be applied to the formation of a wiring through patterning.

Embodiment 6

FIGS. 33A and 33B are plan views showing a pattern generation method of still another embodiment of the present invention.

First, as shown in FIG. 33A, a wiring pattern 90 of the fifth wiring layer and a capacitor pattern 91 in an area in which a capacitor C will be formed are extracted. In this case, longitudinal and crosswise widths of the capacitor pattern 91 are increased so as not to contact another wiring pattern adjacent to the wiring pattern 90.

Then, a graphic operation is applied to the wiring pattern 90 and capacitor pattern 91 to generate the AND pattern 92 of the patterns 90 and 91. The AND pattern 92 is used as the mask pattern of the fifth wiring layer.

Moreover, as shown in FIG. 33B, the wiring pattern 93 of a fourth wiring layer and the above capacitor pattern 91 are extracted. In this case, the longitudinal and crosswise widths of the capacitor pattern 91 are increased so as not to contact another wiring pattern adjacent to the wiring pattern 93.

Then, a graphic operation is applied to the wiring pattern 93 and capacitor pattern 91 to generate the AND pattern of the patterns 93 and 91. The AND pattern 94 is used as the mask pattern of the fourth wiring layer.

By applying the AND patterns 92 and 94 and the capacitor pattern 91 thus generated to the patterning masks of the fifth and fourth wiring layers and applying a pattern for forming holes for forming the conductive member Me serving as the electrode of a capacitor C in the above embodiments 1 to 5, a capacitor-C-forming area 95 is enlarged and the capacitance of the capacitor C can be increased, as shown in FIG. 33C.

The invention made by the present inventor is specifically described in accordance with the embodiments of the present invention. However, the present invention is not restricted to the embodiments. It is needless to say that various modifications of the present invention are allowed as long as the modifications do not deviate from the gist of the present invention.

For example, though the case of using up to the fifth layer is described for the above embodiments, it is also possible to realize a modification having more than five wiring layers or less than five wiring layers (however, two layers or more are necessary).

Figure 34A:
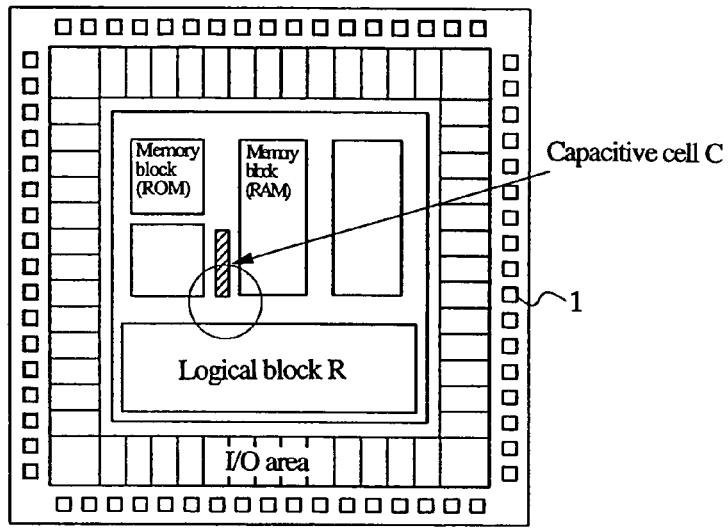
Figure 34B:
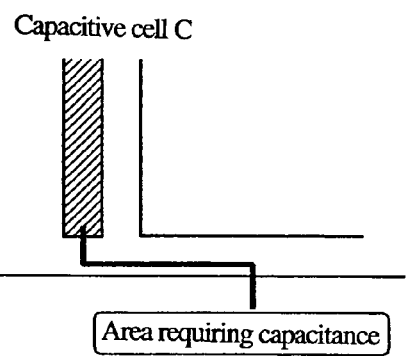
Figure 34C:
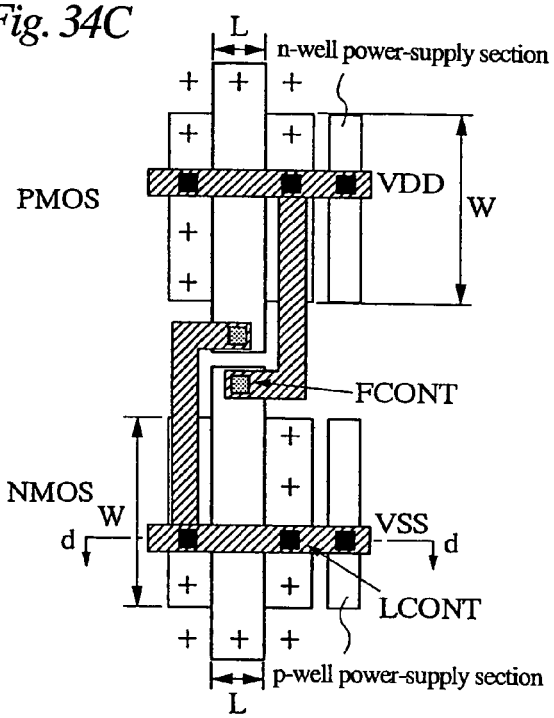
Figure 34D:
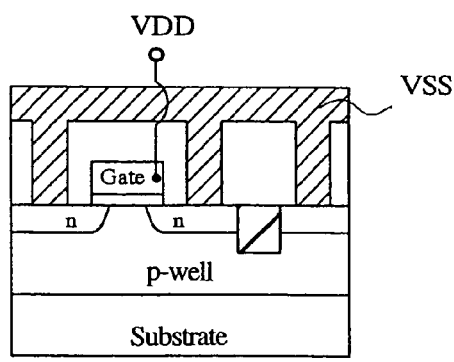

Moreover, though the case of using a gate array is described for the above embodiments, the present invention can also be applied to a cell base IC (CBIC) such as a standard cell. For example, in the case of a semiconductor integrated circuit device using the cell base IC (CBIC) shown in FIG. 34A, a logical block and memory blocks (RAM and ROM) are arranged in an internal area surrounded by an I/O area. Power-source wirings having a width larger than that of lower-layer power-source wirings are formed on an upper layer of a wiring layer in the internal area including the logical block and memory blocks like meshes viewed from the upper layer as in the case of the above embodiments 1 to 6 and a capacitive element (capacitor) C is formed on intersections between the meshes.

Moreover, it is possible to use a capacitive element (capacitor) C of the present invention together with an MIS capacitive element using the capacitive cells shown in FIGS. 34A, 34B, 34C, and 34D. In this case, by forming a capacitive cell in an empty area between a logical block and a memory block, it is possible to form a large stabilizing capacitor without increasing the area required to form the device.

Figure 35A:
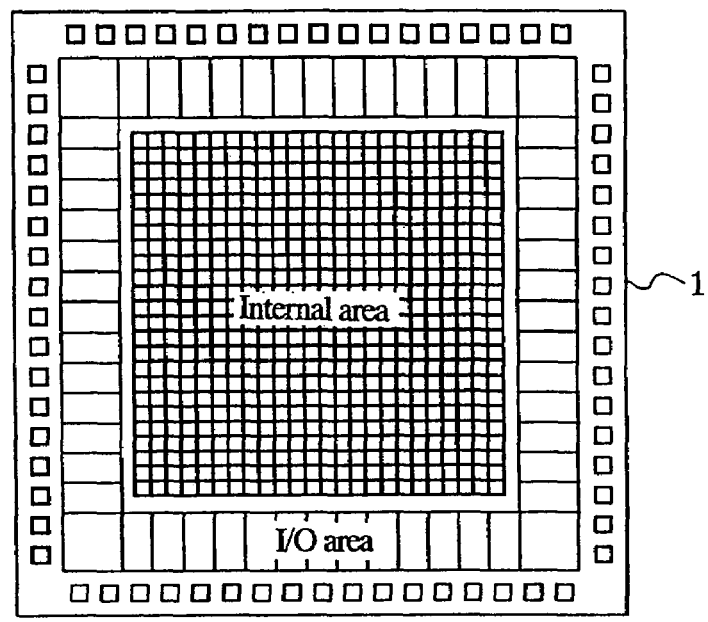
Figure 35B:
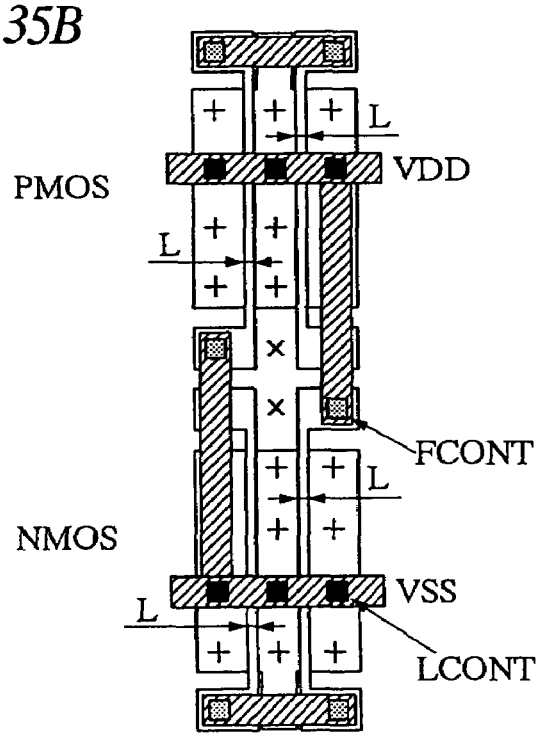

Moreover, it is possible to use a capacitive element (capacitor) C of the present invention together with an MIS capacitive element using the unused basic cells shown in FIGS. 35A and 35B. That is, in the case of the above embodiments 1 to 6, a capacitive element is formed by using an unused basic cell as a capacitive cell. Thereby, it is possible to form a large stabilizing capacitor without increasing the area.

In the above embodiments, a case is described in which a capacitor C is formed between the uppermost layer and a layer under the uppermost layer. In this case, the design rule of wirings is moderated and a wiring dimension is increased for upper-layer wirings. Therefore, forming a capacitor C between upper-layer wirings has an advantage that a large capacitor capacitance can be easily obtained. Moreover, because an upper-layer wiring is more frequently assigned to a power-source wiring, an advantage is also obtained that the number of capacitors can be increased. However, the present invention is not restricted to the fact that a capacitor C is formed between upper-layer wirings. It is needless to say that a capacitor can be formed between lower-layer wirings.

Moreover, in the above embodiments, an MISFET is used as a semiconductor integrated circuit device (semiconductor device). However, it is needless to say that the semiconductor integrated circuit device can use a bipolar transistor or Bi-CMOS transistor.

Furthermore, in the above embodiments, a case is described in which two types of power-source wirings are used, that is, a single power source is used. However, the present invention can be also applied to a case of using three types of power-source wirings or more. In this case, a capacitor is formed between wirings having voltages that are different from each other.

INDUSTRIAL APPLICABILITY

As described above, a semiconductor integrated circuit device and its manufacturing method and a mask-pattern generation method of the present invention use a capacitor to be effectively applied to the reduction of AC noises of the semiconductor integrated circuit device, and particularly, make it possible to obtain a large capacitance value without increasing a capacitor-forming area and the number of wirings.

What is claimed is:

1. A method of manufacturing a semiconductor integrated circuit device having a plurality of wiring layers and including a first wiring layer which is not the uppermost layer among said plurality of wiring layers and a second wiring layer higher than said first wiring layer in said plurality of wiring layers, comprising:
   (a) a step of depositing a first insulating film, a second insulating film, and a third insulating film in order on said first wiring layer;
   (b) a step of patterning a first mask film having an opening in an area in which holes will be formed on said third insulating film and etching said third insulating film under presence of said first mask film;
   (c) a step of removing said first mask film and depositing a fourth insulating film and a fifth insulating film in order on said third and second insulating films;
   (d) a step of patterning a second mask film having an opening in an area in which trenches will be formed on said fifth insulating film and etching said fifth insulating film under presence of said second mask film;
   (e) a step of etching said fourth insulating film by using the second mask film or said fifth insulating film as a mask, forming the trenches patterned on said fifth insulating film on said fourth insulating film, etching said second insulating film by using said third insulating film as a mask, and forming the holes patterned on said insulating film on said second insulating film;
   (f) a step of removing said third insulating film and said first insulating film exposed to bottoms of said trenches and holes;
   (g) a step of depositing a sixth insulating film on the entire surface of a semiconductor substrate including insides of said trenches and holes;
   (h) a step of patterning a third mask film for covering at least some of said holes;
   (i) a step of etching said sixth insulating film under presence of said third mask film;
   (j) a step of removing said third mask film and forming a conductive film for filling up said trenches and holes; and
   (k) a step of removing said conductive film from areas other than said trenches and forming wirings comprising said second wiring layer and a conductive member.

2. The semiconductor integrated circuit device manufacturing method according to claim 1, wherein the permittivity of said first or sixth insulating film is higher than that of said second insulating film.

3. A method of manufacturing a semiconductor device according to claim 1, wherein the thickness of said first or sixth insulating film is smaller than that of said second insulating film.

4. The semiconductor integrated circuit device manufacturing method according to claim 3, wherein the permittivity of said first or sixth insulating film is higher than that of said second insulating film.

5. A method of manufacturing a semiconductor integrated circuit device manufacturing method according to claim 1, wherein:

said first and third insulating films are formed of a material having an etching selection ratio to said second and fourth insulating films and the thickness of said first insulating film is equal to that of said third insulating film.

6. A method of manufacturing a semiconductor device according to claim 5, wherein the thickness of said first or sixth insulating film is smaller than that of said second insulating film.

7. The semiconductor integrated circuit device manufacturing method according to claim 5, wherein the permittivity of said first or sixth insulating film is higher than that of said second insulating film.

8. A method of manufacturing a semiconductor integrated circuit device having a plurality of wiring layers and including a first wiring layer which is not the uppermost layer among said plurality of wiring layers and a second wiring layer higher than said first wiring layer in said plurality of wiring layers, comprising:

(a) a step of depositing a first insulating film, a second insulating film, and a third insulating film in order on said first wiring layer;

(b) a step of patterning a first mask film having an opening in an area in which holes will be formed on said third insulating film and etching said third insulating film under presence of said first mask film;

(c) a step of removing said first mask film and depositing a fourth insulating film and a fifth insulating film in order on said third and second insulating films;

(d) a step of patterning a second mask film having an opening in an area in which trenches will be formed on said fifth insulating film and etching said fifth insulating film under presence of said second mask film;

(e) a step of etching said fourth insulating film by using the second mask film or said fifth insulating film as a mask, forming the trenches patterned on said fifth insulating film on said fourth insulating film, etching said second insulating film by using said third insulating film as a mask, and forming the holes patterned on said insulating film on said second insulating film;

(f) a step of patterning a third mask film for covering at least some of said holes;

(g) a step of etching said first insulating film at bottoms of said holes and said third insulating film at bottoms of said trenches under presence of the third mask film and patterned fifth insulating film;

(h) a step of removing said third mask film and forming a conductive film for filling up said trenches and holes; and (i) a step of removing said conductive film from areas other than said trenches and forming wirings for comprising said second wiring layer and a conductive member.

9. The semiconductor integrated circuit device manufacturing method according to claim 8, wherein the permittivity of said first or sixth insulating film is higher than that of said second insulating film.

10. A method of manufacturing a semiconductor device according to claim 8, wherein the thickness of said first or sixth insulating film is smaller than that of said second insulating film.

11. A method of manufacturing a semiconductor integrated circuit device manufacturing method according to claim 8, wherein:

said first and third insulating films are formed of a material having an etching selection ratio to said second and fourth insulating films and the thickness of said first insulating film is equal to that of said third insulating film.

12. A method of manufacturing a semiconductor device according to claim 11, wherein the thickness of said first or sixth insulating film is smaller than that of said second insulating film.

13. A method of manufacturing a semiconductor integrated circuit device according to claim 8, further comprising a step of depositing a sixth insulating film on the entire surface of a semiconductor substrate including insides of said trenches and holes before forming said third mask film, wherein said sixth insulating film not covered with said third mask film is removed together with said first insulating film in the step of etching said first insulating film at bottoms of said holes.

14. A method of manufacturing a semiconductor device according to claim 13, wherein the thickness of said first or sixth insulating film is smaller than that of said second insulating film.

15. The semiconductor integrated circuit device manufacturing method according to claim 13, wherein the permittivity of said first or sixth insulating film is higher than that of said second insulating film.

16. A method of manufacturing a semiconductor integrated circuit device manufacturing method according to claim 13, wherein:

said first and third insulating films are formed of a material having an etching selection ratio to said second and fourth insulating films and the thickness of said first insulating film is equal to that of said third insulating film.

17. A method of manufacturing a semiconductor device according to claim 16, wherein the thickness of said first or sixth insulating film is smaller than that of said second insulating film.

18. A method of manufacturing a semiconductor integrated circuit device having a plurality of wiring layers and including a first wiring layer which is not the uppermost layer among said plurality of wiring layers and a second wiring layer higher than said first wiring layer in said plurality of wiring layers, comprising:

(a) a step of depositing a first insulating film, a second insulating film, a third insulating film, a fourth insulating film, and a fifth insulating film in order on said first wiring layer;

(b) a step of patterning a first mask film having an opening in an area in which holes will be formed on said fifth insulating film, etching said fifth, fourth, third, and second insulating films under presence of said first mask film, and forming holes;

(c) a step of removing said first mask film, forming a second mask film on said fifth insulating film, exposing an area in which trenches will be formed, developing said second mask film, and leaving said mask film in areas other than the area in which said trenches will be formed and in said holes;

(d) a step of etching said fifth and the fourth insulating film and forming trenches presence of the second mask film;

(e) a step of removing said second mask film and patterning a third mask film for covering at least some of said holes;

(f) a step of etching said first insulating film at the bottoms of said holes under presence of said third mask film;

(g) a step of removing said third mask film and forming a conductive film for filling up said trenches and holes; and (h) a step of removing said conductive film in areas other than said trenches and forming wiring comprising said second wiring layer and a conductive member.

19. A method of manufacturing a semiconductor device according to claim 18, wherein the thickness of said first or sixth insulating film is smaller than that of said second insulating film.

20. The semiconductor integrated circuit device manufacturing method according to claim 18, wherein the permittivity of said first or sixth insulating film is higher than that of said second insulating film.

21. A method of manufacturing a semiconductor integrated circuit device manufacturing method according to claim 18, wherein:
said first and third insulating films are formed of a material having an etching selection ratio to said second and fourth insulating films and the thickness of said first insulating film is equal to that of said third insulating film.

22. A method of manufacturing a semiconductor device according to claim 21, wherein the thickness of said first or sixth insulating film is smaller than that of said second insulating film.

23. A method of manufacturing a semiconductor integrated circuit device according to claim 18, further comprising a step of depositing a sixth insulating film on the entire surface of a semiconductor substrate including insides of said trenches and holes before forming said third mask film, wherein said sixth insulating film not covered with said third mask film is removed together with said first insulating film in the step of etching said first insulating film at bottoms of said holes.

24. A method of manufacturing a semiconductor device according to claim 23, wherein the thickness of said first or sixth insulating film is smaller than that of said second insulating film.

25. The semiconductor integrated circuit device manufacturing method according to claim 23, wherein the permittivity of said first or sixth insulating film is higher than that of said second insulating film.

26. A method of manufacturing a semiconductor integrated circuit device manufacturing method according to claim 23, wherein:
said first and third insulating films are formed of a material having an etching selection ratio to said second and fourth insulating films and the thickness of said first insulating film is equal to that of said third insulating film.

27. A method of manufacturing a semiconductor device according to claim 26, wherein the thickness of said first or sixth insulating film is smaller than that of said second insulating film.

28. A method of manufacturing a semiconductor integrated circuit device having a plurality of wiring layers and including a first wiring layer which is not the uppermost layer among said plurality of wiring layers and a second wiring layer higher than said first wiring layer in said plurality of wiring layers, comprising:

(a) a step of depositing a seventh insulating film for covering said first wiring layer;

(b) a step of patterning a first mask film having an opening in an area in which holes will be formed on said seventh insulating film, etching said seventh insulating film under presence of said first mask film, and removing said seventh insulating film onto wirings comprising said first wiring layer;

(c) a step of depositing a sixth insulating film on the entire surface of a semiconductor substrate including insides of said holes;

(d) a step of pattering a third mask film for covering at least some of said holes;

(e) a step of etching said sixth insulating film under presence of said third mask film;

(f) a step of removing said third mask film and forming a conductive film for filling up said holes;

(g) a step of removing said conductive film from areas other than said holes and forming a conductive member to be connected to wirings comprising said second wiring layer; and (h) a step of depositing a second conductive film on the entire surface of said semiconductor substrate, patterning said second conductive film, and forming said second wiring layer.

29. A method of manufacturing a semiconductor device according to claim 28, wherein the thickness of said first or sixth insulating film is smaller than that of said second insulating film.

30. The semiconductor integrated circuit device manufacturing method according to claim 28, wherein the permittivity of said first or sixth insulating film is higher than that of said second insulating film.

31. A method of manufacturing a semiconductor integrated circuit device manufacturing method according to claim 28, wherein: said first and third insulating films are formed of a material having an etching selection ratio to said second and fourth insulating films and the thickness of said first insulating film is equal to that of said third insulating film.

32. A method of manufacturing a semiconductor device according to claim 31, wherein the thickness of said first or sixth insulating film is smaller than that of said second insulating film.

33. A method of generating a mask-pattern used for a method of manufacturing a semiconductor integrated circuit device having a plurality of wiring layers and including a first wiring layer which is not the uppermost layer among said plurality of wiring layers and a second wiring layer higher than said first wiring layer in said plurality of wiring layers, comprising:

(a) a first step of determining an intersectional area where a first power-source wiring to which a first potential is assigned among power-source wiring comprising said wiring layer intersects a second power-source wiring to which a second potential different from said first potential is assigned among power-source wiring comprising said second wiring layer;
a second step of generating a hole pattern in said intersectional area; and
a third step of expanding the width of said hole pattern so as not to reach wiring areas of said first and second wiring layers adjacent to said hole pattern.

34. The method of generating a mask-pattern according to claim 33,
wherein said semiconductor integrated circuit device has a capacitive element in said intersectional area between said first power-source wiring and said second power-source wiring.

35. The method of generating a mask-pattern according to claim 34, further comprising:
a fourth step of generating a mask-pattern for said first wiring layer by synthesizing a wiring pattern of said first wiring layer and said hole pattern and generating a mask-pattern for said second wiring layer by synthesizing a wiring pattern of said second wiring layer and said hole pattern.

36. The method of generating a mask-pattern according to claim 34, wherein said third step includes expanding the area of the hole pattern for the capacitive element.

37. A method of generating a mask-pattern according to claim 36,
wherein a fourth step of generating a mask-pattern for said first wiring layer by synthesizing a wiring pattern of said first wiring layer and said hole pattern and generating a mask-pattern for said second wiring layer by synthesizing a wiring pattern of said second wiring layer and said hole pattern.

* * * * *